(12) United States Patent
Wang et al.

(10) Patent No.: US 12,120,913 B2
(45) Date of Patent: Oct. 15, 2024

(54) DISPLAY PANEL AND DISPLAY APPARATUS

(71) Applicant: KunShan Go Visionox Opto Electronics Co., Ltd, Jiangsu (CN)

(72) Inventors: Gang Wang, Kunshan (CN); Hongjun Xie, Kunshan (CN); Yusheng Liu, Kunshan (CN); Liwei Ding, Kunshan (CN); Lei Mi, Kunshan (CN)

(73) Assignee: KunShan Go Visionox Opto Electronics Co., Ltd, Kunshan (CN)

( * ) Notice: Subject to any disclaimer, the term of this patent is extended or adjusted under 35 U.S.C. 154(b) by 0 days.

(21) Appl. No.: 18/488,465

(22) Filed: Oct. 17, 2023

(65) Prior Publication Data
US 2024/0065029 A1 Feb. 22, 2024

Related U.S. Application Data

(63) Continuation of application No. PCT/CN2022/107279, filed on Jul. 22, 2022.

(30) Foreign Application Priority Data

Jan. 29, 2022 (CN) .......................... 202210111313.9

(51) Int. Cl.
H10K 59/121 (2023.01)
G09G 3/3233 (2016.01)
(Continued)

(52) U.S. Cl.
CPC ......... H10K 59/121 (2023.02); G09G 3/3233 (2013.01); H10K 59/131 (2023.02);
(Continued)

(58) Field of Classification Search
CPC ......... G09G 3/3233; G09G 2300/0408; G09G 2300/0465; G09G 2300/0804;
(Continued)

(56) References Cited

U.S. PATENT DOCUMENTS

| 2020/0124927 | A1  | 4/2020 | Kim et al. |
| 2021/0217821 | A1  | 7/2021 | Han et al. |
| 2022/0238071 | A1* | 7/2022 | Chen .................... G09G 3/3233 |

FOREIGN PATENT DOCUMENTS

| CN | 105405865 A | 3/2016 |
| CN | 110783487 A | 2/2020 |

(Continued)

OTHER PUBLICATIONS

International Search Report issued Oct. 28, 2022, in corresponding International Application No. PCT/CN2022/107279, 6 pages.

(Continued)

Primary Examiner — Mihir K Rayan
(74) Attorney, Agent, or Firm — Maier & Maier, PLLC

(57) ABSTRACT

A display panel and a display apparatus, and the display panel includes a first display area and a second display area. The display panel includes: a plurality of pixel blocks including a plurality of sub-pixels, each of the pixel blocks including a sub-pixels of the plurality of sub-pixels, the plurality of sub-pixels including a plurality of first sub-pixels located in the first display area and a plurality of second sub-pixels located in the second display area; and a plurality of circuit blocks located in the second display area, each of the circuit blocks including b pixel circuits, the b pixel circuits including first circuits and second circuits; an orthographic projection of the circuit block in a thickness direction of the display panel is located within an orthographic projection of the pixel block in the thickness direction.

20 Claims, 15 Drawing Sheets

(51) Int. Cl.
*H10K 59/131* (2023.01)
*H10K 59/35* (2023.01)
*H10K 59/65* (2023.01)

(52) U.S. Cl.
CPC ... *H10K 59/353* (2023.02); *G09G 2300/0408* (2013.01); *G09G 2300/0465* (2013.01); *G09G 2300/0804* (2013.01); *H10K 59/65* (2023.02)

(58) Field of Classification Search
CPC .. H10K 59/121; H10K 59/131; H10K 59/353; H10K 59/65
See application file for complete search history.

(56) References Cited

FOREIGN PATENT DOCUMENTS

| CN | 110808267 A | 2/2020 |
|---|---|---|
| CN | 111180494 A | 5/2020 |
| CN | 111261677 A | 6/2020 |
| CN | 111508337 A | 8/2020 |
| CN | 111508377 A | 8/2020 |
| CN | 112634809 A | 4/2021 |
| CN | 113066847 A | 7/2021 |
| CN | 113140609 A | 7/2021 |
| CN | 113506539 A | 10/2021 |
| CN | 113539130 A | 10/2021 |
| CN | 113823214 A | 12/2021 |
| CN | 113937148 A | 1/2022 |
| CN | 114464658 A | 5/2022 |

OTHER PUBLICATIONS

Office Action issued Nov. 3, 2022, in Chinese Application No. 202210111313.9, 15 pages.

Office Action issued Feb. 5, 2023, in Chinese Application No. 202210111313.9, 8 pages(partial English translation provided).

* cited by examiner

DISPLAY PANEL AND DISPLAY APPARATUS

CROSS REFERENCE TO RELATED APPLICATION

The present application is a continuation of International Application No. PCT/CN2022/107279 filed on Jul. 22, 2022, which claims priority to Chinese Patent Application No. 202210111313.9 filed on Jan. 29, 2022, both of which are incorporated herein by reference in their entireties.

TECHNICAL FIELD

The present application relates to the field of display, and particularly to a display panel and a display apparatus.

BACKGROUND

With the rapid development of electronic devices, demands of users for the screen-to-body ratio are higher and higher, resulting in that the full-screen display of electronic devices attracts more and more attention in the industry.

Traditional electronic devices such as a cell phone and a tablet computer need to integrate a front camera, a telephone receiver, an infrared sensing component and the like. In the prior art, sub-pixels may be arranged in a photosensitive area where a photosensitive component such as a camera is located, and pixel circuits corresponding to the sub-pixels may be arranged at other positions in a display area. In addition, in order to achieve a narrow frame design in some display panels, pixel circuits originally close to a frame display area will be placed at other positions. All the above results in non-uniform arrangement density of the pixel circuits in the display area, which causes display difference in the display panel.

SUMMARY

Embodiments of the present application provide a display panel and a display apparatus, which are intended to improve the display effect of the display panel.

Embodiments of a first aspect of the present application provide a display panel including a first display area and a second display area, the display panel including: a plurality of pixel blocks including a plurality of sub-pixels, each of the pixel blocks including a sub-pixels of the plurality of sub-pixels, the plurality of sub-pixels including a plurality of first sub-pixels located in the first display area and a plurality of second sub-pixels located in the second display area; and a plurality of circuit blocks located in the second display area, each of the circuit blocks including b pixel circuits, the b pixel circuits including first circuits and second circuits, at least part of the first circuits being configured to drive the first sub-pixels, and the second circuits being configured to drive the second sub-pixels; herein both a and b are positive integers greater than 0, and a is less than b, in the second display area, an orthographic projection of the circuit block in a thickness direction of the display panel is located within an orthographic projection of the pixel block in the thickness direction.

Embodiments of a second aspect of the present application provide a display apparatus including the display panel according to the embodiments of the first aspect.

In the display panel according to the embodiments of the first aspect of the present application, the circuit blocks are located in the second display area, that is, the pixel circuits for driving the first sub-pixels and the second sub-pixels are all located in the second display area, so that the light transmittance of the first display area can be greater than the light transmittance of the second display area. Photosensitive components may be integrated at the back of the first display area of the display panel to achieve under-screen integration for the photosensitive components such as a camera. Alternatively, driving circuits such as a shift register of the display panel may be arranged in the first display area to achieve a narrow frame design for the display panel.

In the display panel according to the embodiments of the first aspect of the present application, the circuit blocks are located in the second display area, each of the circuit blocks includes b pixel circuits, the pixel block in the second display area includes a second sub-pixels, and b is greater than a, so that the spare first circuits in at least part of the circuit blocks can be used to drive the first sub-pixels in the first display area. An orthographic projection of the circuit block in a thickness direction of the display panel is located within an orthographic projection of the pixel block in the thickness direction. On the one hand, it can be guaranteed that in the second display area, the arrangement of the circuit blocks is the same as the arrangement of the pixel blocks, the arrangement of the circuit blocks is more uniform, the display effect of the second display area is improved, and further the display effect of the display panel is improved. On the other hand, the distance between the second circuit in at least part of the circuit blocks and the second sub-pixel driven by the second circuit can be reduced, the length of the wrings between at least part of the second circuits and the second sub-pixels can be reduced, and the signal transmission stability is guaranteed.

DETAILED DESCRIPTION

In an electronic device such as a mobile phone and a tablet computer, photosensitive components such as a front camera, an infrared light sensor, and a proximity light sensor need to be integrated at a side of the display panel. In some embodiments, a light-transmitting display area may be arranged on the electronic device and the photosensitive components may be arranged at the back of the light-transmitting display area, so that a full-screen display can be achieved for the electronic device while ensuring that the photosensitive components operate normally.

In order to increase the light transmittance of the light-transmitting display area, the driving circuits for the light-transmitting area are usually arranged in a non-light-transmitting area, which causes non-uniform display in the non-light-transmitting area of the display panel.

In order to solve the problems described above, the embodiments of the present application provide a display panel and a display apparatus, which will be described below with reference to the accompanying drawings.

The embodiments of the present application provide a display panel 100, which may be an organic light emitting diode (OLED) display panel 100.

Figure 1:
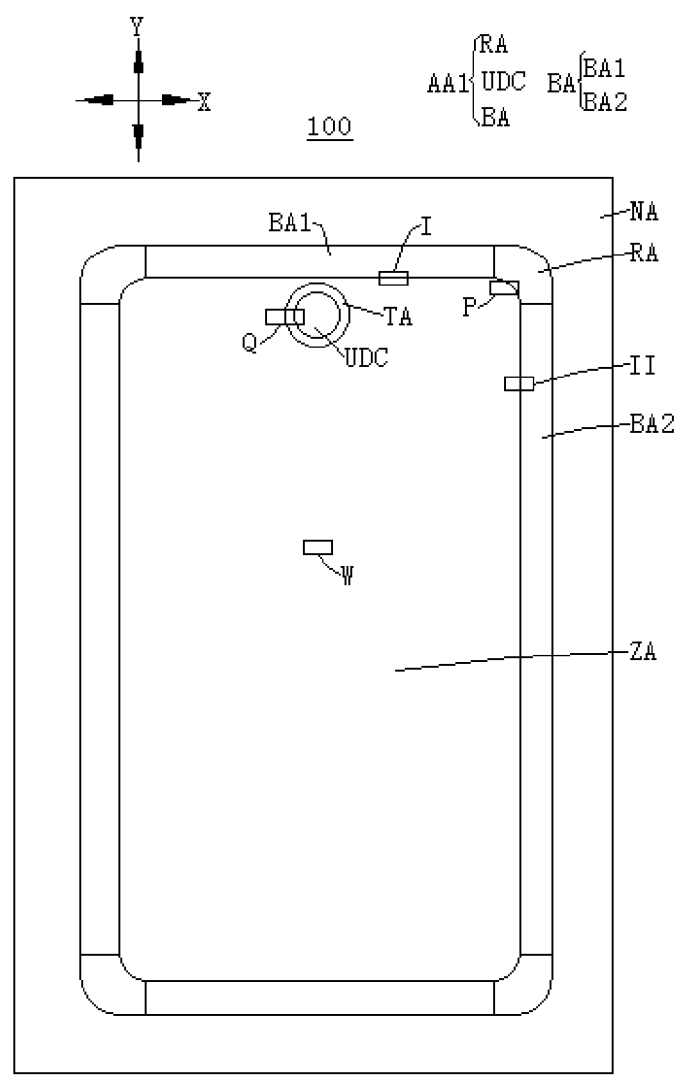
FIG. 1 shows a schematic structural diagram of a display panel according to the embodiments of the first aspect of the present application.
Figure 2:
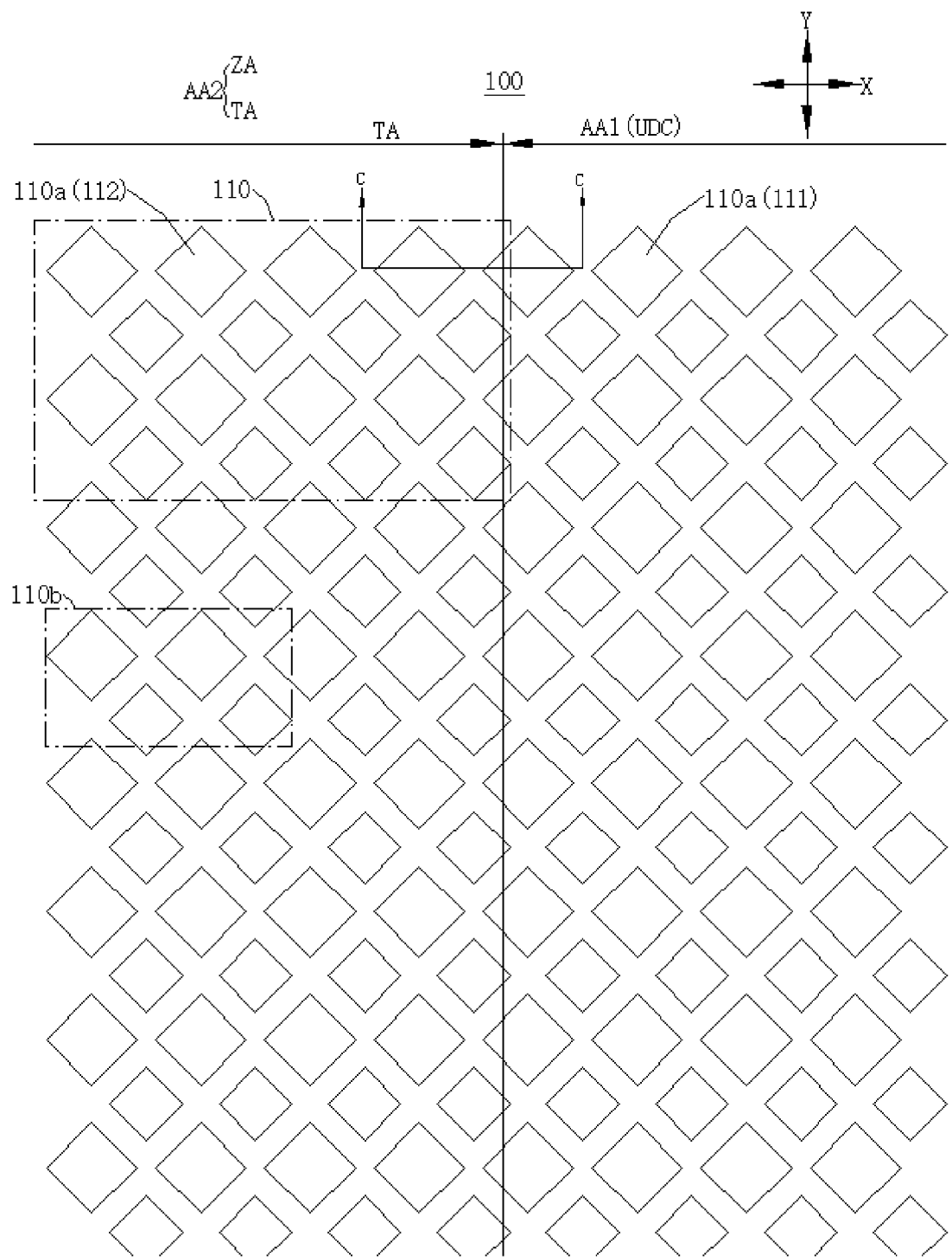
FIG. 2 shows a schematic arrangement structure diagram of sub-pixels in area Q in FIG. 1 in an example.
Figure 3:
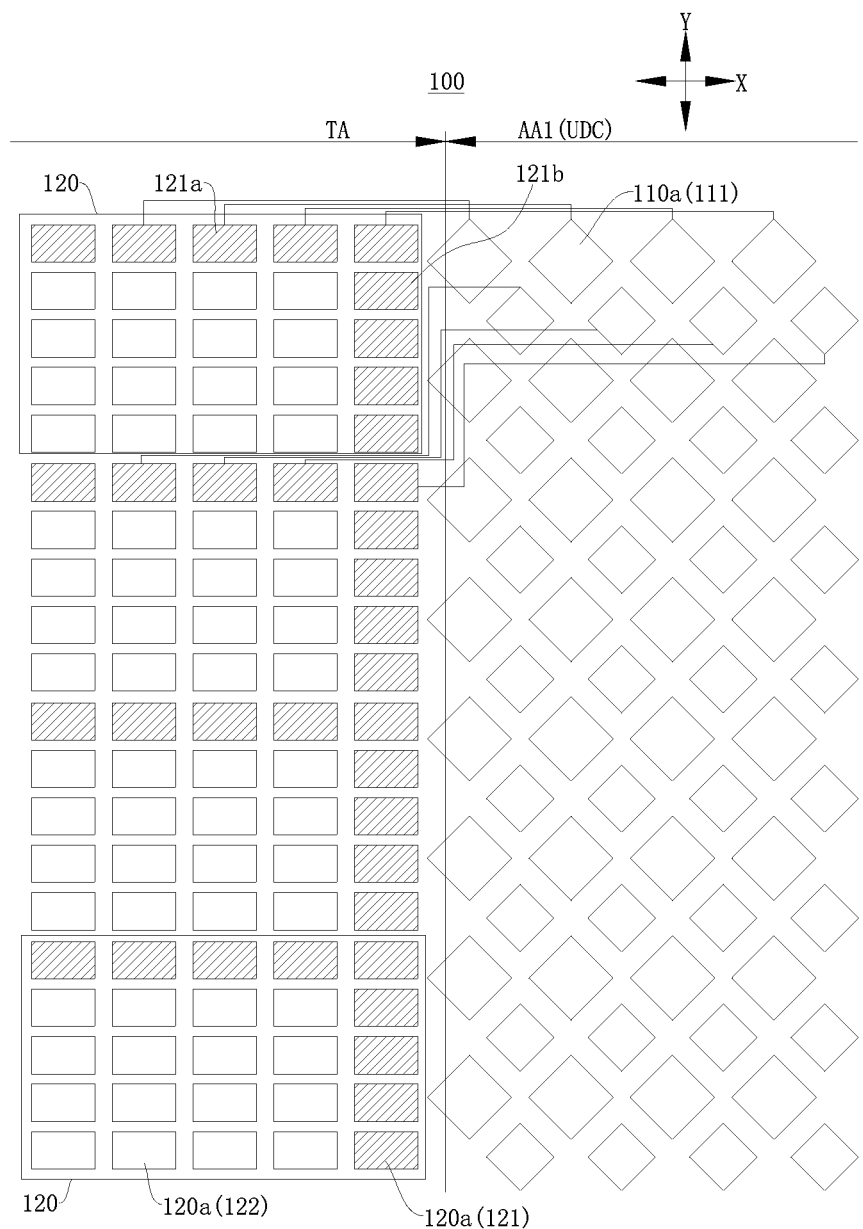
FIG. 3 shows a schematic arrangement structure diagram of pixel circuits in area Q in FIG. 1 in an example.

Reference is made to FIG. 1 to FIG. 3 together, in which FIG. 1 shows a schematic top view of a display panel 100 according to the embodiments of the present application, FIG. 2 shows a partial enlarged schematic structural diagram of area Q in FIG. 1, and FIG. 3 shows a partial enlarged schematic structural diagram of area Q in FIG. 1 in another example. FIG. 2 and FIG. 3 illustrate different layer structures. FIG. 2 illustrates an arrangement structure diagram of sub-pixels 110a in Q in FIG. 1, and FIG. 3 differs from FIG. 2 in that FIG. 3 illustrates an arrangement structure diagram of pixel circuits 120a in a second display area AA2 in Q, and further illustrates a schematic arrangement structure diagram of the sub-pixels 110a in a first display area AA1.

As shown in FIG. 1 to FIG. 3, the embodiments of the first aspect of the present application provide a display panel 100 including the first display area AA1 and the second display area AA2, and the display panel 100 includes: a plurality of sub-pixels including a plurality of first sub-pixels 111 located in the first display area AA1 and a plurality of second sub-pixels 112 located in the second display area AA2; a plurality of pixel blocks 110 including the plurality of sub-pixels, each of the pixel blocks 110 including a sub-pixels 110a of the plurality of sub-pixels, the plurality of sub-pixels 110a including a plurality of first sub-pixels 111 located in the first display area AA1 and a plurality of second sub-pixels 112 located in the second display area AA2; and a plurality of circuit blocks 120 located in the second display area AA2, each of the circuit blocks 120 including b pixel circuits 120a, the b pixel circuits 120a including first circuits 121 and second circuits 122, at least part of the first circuits 121 being configured to drive the first sub-pixels 111, and the second circuits 122 being configured to drive the second sub-pixels 112; herein both a and b are positive integers greater than 0, and a is less than b, in the second display area AA2, an orthographic projection of the circuit block 120 in a thickness direction of the display panel 100 is located within an orthographic projection of the pixel block 110 in the thickness direction. The structures of the pixel block 110 and the circuit block 120 are defined by rectangular boxes in FIG. 2 and FIG. 3, but the structure of the display panel 100 in the present application is not limited by the rectangular boxes. The rectangular box includes a small portion of a sub-pixel 110a which does not belong to a same pixel block 110, and a sub-pixel 100a with an area within the rectangular box greater than 50% of a total area of the sub-pixel 100a is the sub-pixel 110a within the pixel block 110 represented by the rectangular box.

All of the a sub-pixels 110a in each pixel block 110 located in the first display area AA1 are the first sub-pixels 111, and all of the a sub-pixel 110a in each pixel block 110 located in the second display area AA2 are the second sub-pixel 112.

In the display panel 100 according to the embodiments of the first aspect of the present application, the circuit blocks 120 are located in the second display area AA2, that is, the pixel circuits 120a for driving the first sub-pixels 111 and the second sub-pixels 112 are all located in the second display area AA2, so that the light transmittance of the first display area AA1 can be greater than the light transmittance of the second display area AA2. Photosensitive components may be integrated at the back of the first display area AA1 of the display panel 100 to achieve under-screen integration for the photosensitive components such as cameras. Alternatively, driving circuits such as a shift register of the display panel 100 may be arranged in the first display area AA1 to achieve a narrow frame design for the display panel 100.

In the display panel 100 according to the embodiments of the first aspect of the present application, the circuit blocks 120 are located in the second display area AA2, each of the circuit blocks 120 includes b pixel circuits 120a, the pixel block 110 includes a second sub-pixels 112 located in the second display area AA2, b is greater than a, a second circuits 122 are arranged in the circuit block 120 so as to drive the a second sub-pixels 112 in the pixel block 110, (b-a) first circuits 120 may be arranged in the circuit block 120, and at least part of the first circuits 121 in the circuit block 120 can be used to drive the first sub-pixels 111 in the first display area AA1. An orthographic projection of the circuit block 120 in a thickness direction of the display panel 100 is located within an orthographic projection of the pixel block 110 in the thickness direction. On the one hand, it can be guaranteed that in the second display area AA2, the arrangement of a plurality of second circuits 122 in the circuit block 120 is the same as the arrangement of a plurality of second sub-pixels 112 in the pixel block 110, the arrangement of the circuit blocks 120 is more uniform, and the display effect of the second display area AA2 is improved. On the other hand, the distance between the second circuit 122 in at least part of the circuit blocks 120 and the second sub-pixel 112 driven by the second circuit 122 can be reduced, the length of the wirings between at least part of the second circuits 122 and the second sub-pixels 112 can be reduced, and the signal transmission stability is guaranteed.

Optionally, the pixel block 110 in the second display area AA2 includes a second sub-pixels 112, and the pixel block 110 in the first display area AA1 includes a first sub-pixels 111. If a part of display area is located between the first display area AA1 and the second display area AA2, the pixel block 110 between the first display area AA1 and the second display area AA2 may further include the first sub-pixels 111 and the second sub-pixel 112, and a sum of the number of the first sub-pixels 111 and the number of the second sub-pixels 112 is a.

Optionally, the circuit block 120 may include b first circuits 121 or b second circuits 122. In some other embodiments, the pixel circuit 120a may include both the first circuit 121 and the second circuit 122, and a sum of the number of the first circuits 121 and the number of the second circuits 122 is b.

In some optional embodiments, in the second display area AA2, an area of the orthographic projection of the pixel block 110 in the thickness direction overlaps the orthographic projection of the circuit block 120 in the thickness direction, so that the area of the sub-pixels 110a in the pixel block 110 is relatively great.

Optionally, still referring to FIG. 3, a distribution area of the first circuit 121 is equal to a distribution area of the second circuit 122, so that the display effect of the second display area AA2 can be further improved, and display difference due to different distribution areas of the first circuit 121 and the second circuit 122 can be avoided. Optionally, a circuit structure of the first circuit 121 is the same as a circuit structure of the second circuit 122, but the first circuit 121 is configured to drive the first sub-pixel 111, while the second circuit 122 is configured to drive the second sub-pixel 112.

The orthographic projection of the circuit block 120 in the thickness direction of the display panel 100 is the orthographic projection of the circuit block 120 on a display surface of the display panel 100. The orthographic projection of the pixel block 110 in the thickness direction is the orthographic projection of the pixel block 110 on the display surface of the display panel 100.

Optionally, the orthographic projection of the pixel block 110 in the thickness direction of the display panel 100 is an area where the orthographic projections of the a sub-pixels 110a in the pixel block 110 in the thickness direction of the display panel 100 are located. For example, under a condition that the sub-pixels 110a are arranged to form a pixel arrangement structure, the area where the pixel block 110 is located is the arrangement area occupied by the a sub-pixels 110a in the pixel arrangement structure. For example, under a condition that the size of the pixel arrangement structure is 10 cm×10 cm and the sub-pixels 110a in the pixel arrangement structure are distributed in 10 rows and 10 columns, the arrangement size of a single sub-pixel 110a is 1 cm×1 cm, that is, the size of the orthographic projection of a single sub-pixel 110a in the thickness direction of the display panel 100 is 1 cm×1 cm, and the area where the pixel block 110 is located is an area formed by a areas of 1 cm×1 cm. This is merely for illustration and does not mean that the actual arrangement size of the sub-pixel 110a is 1 cm×1 cm.

The a sub-pixels 110a in the pixel block 110 are arranged adjacently. For example, as shown in FIG. 2 and FIG. 3, if a is equal to 16 and the pixel block 110 includes 16 sub-pixels 110a, the 16 sub-pixels 110a in pixel block 110 are arranged adjacently. The 16 sub-pixels 110a may be located in a same row or two or more adjacent rows.

Optionally, as shown in FIG. 2 and FIG. 3, under a condition that two sub-pixels 110a adjacent in a row direction and/or a column direction overlap, the area where the orthographic projection of the a sub-pixels 110a in the thickness direction of the display panel 100 is located is of an average arrangement size of the a sub-pixels 110a. The row direction may be a first direction X, and the column direction may be a second direction Y. In some other embodiments, the row direction may be the second direction Y, and the column direction may be the first direction X.

Optionally, as shown in FIG. 2, the sub-pixels 110a of the display panel 100 are arranged to form a pixel arrangement structure which includes a plurality of repeating units, the repeating unit includes a plurality of sub-pixels 110a, and the repeating units are arranged repeatedly in the row direction and the column direction to form the pixel arrangement structure. The number of the sub-pixels 110a included in the pixel block 110 may be related to the number of the sub-pixels 110a included in the repeating unit, for example, the number of the sub-pixels 110a included in the pixel block 110 is an integral multiple of the number of the sub-pixels 110a included in the repeating unit. For example, as shown in FIG. 2, under a condition that the repeating unit includes four sub-pixels 110a, the pixel block 110 includes sixteen sub-pixels 110a, the number of the sub-pixels 110a included in the pixel block 110 is four times as many as the number of the sub-pixels 110a included in the repeating unit, that is, the pixel block 110 includes four repeating units, and the orthographic projection of the pixel block 110 in the thickness direction is the arrangement size occupied by the four repeating units.

Optionally, the orthographic projection of the circuit block 120 in the thickness direction of the display panel 100 is an area where the orthographic projection of the b sub-pixels 110a in the circuit block 120 in the thickness direction is located. The b pixel circuits 120a in the circuit block 120 are arranged adjacently. For example, under a condition that b is equal to 25 and the circuit block 120 includes 25 pixel circuits 120a, the 25 pixel circuits 120a are arranged adjacently. The 25 pixel circuits 120a may be located in a same row or two or more rows.

Optionally, under a condition that the a sub-pixels 110a in the pixel block 110 are arranged in a same row, the b pixel circuits 120a in the circuit block 120 are arranged in a same row. The pixel circuits 120a in circuit block 120 are compressed in the row direction, so that the orthographic projection of the b pixel circuits 120a in the thickness direction is located within the orthographic projection of the a sub-pixels 110a in the thickness direction.

In some optional embodiments, the pixel block 110 includes a plurality of the sub-pixels 110a distributed in p rows and q columns, and a product of p and q is a; the circuit block 120 includes a plurality of the pixel circuits 120a distributed in e rows and f columns, and a product of e and f is b, in which p, q, e and f are all positive integers greater than 1, e≥p and f≥q.

In these optional embodiments, p, q, e and f are all positive integers greater than 1, and thus the pixel block 110 includes the sub-pixels 110a arranged in a plurality of rows and a plurality of columns, and the circuit block 120 includes the pixel circuits 120a arranged in a plurality of rows and a plurality of columns, so that the pixel circuits 120a are compressed in both the row direction and the column direction, thereby avoiding the technical difficulty due to the compression of the pixel circuits 120a in a same direction.

P, q, e and f may be set in a variety of ways, and in some optional embodiments, p is equal to q, e is equal to f, and e is greater than p. That is, the pixel block 110 includes p rows and p columns of the sub-pixels 110a, and the circuit block 120 includes e rows and e columns of the pixel circuits 120a, so that the plurality of sub-pixels 110a in the pixel block 110 are arranged more regularly and the plurality of pixel circuits 120a in the circuit block 120 are arranged more regularly, and the size of the pixel circuits 120a can be adjusted more easily.

As described above, as shown in FIG. 2 and FIG. 3, for example, under a condition that a is equal to 16 and the pixel block 110 includes 16 sub-pixels 110a, the pixel block 110 includes 4 rows and 4 columns of the sub-pixels 110a. Under a condition that b is equal to 25 and the circuit block 120 includes 25 pixel circuits 120a, the circuit block 120 includes 5 rows and 5 columns of the pixel circuits 120a.

In the display panel 100 according to the embodiments of the present application, in the second display area AA2, five rows and five columns of the pixel circuits 120 are arranged in an area where four rows and four columns of the sub-pixels 110a are located. The number of the pixel circuits 120*a* arranged in the area where the four rows and four columns of the sub-pixels 110*a* are located is greater than the number of the sub-pixels 110*a*, and at least part of one row and one column of the pixel circuits 120*a* that are spare in the area where the four rows and four columns of the sub-pixels 110*a* are located may be configured to drive the first sub-pixels 111 in the first display area AA1.

Figure 4:
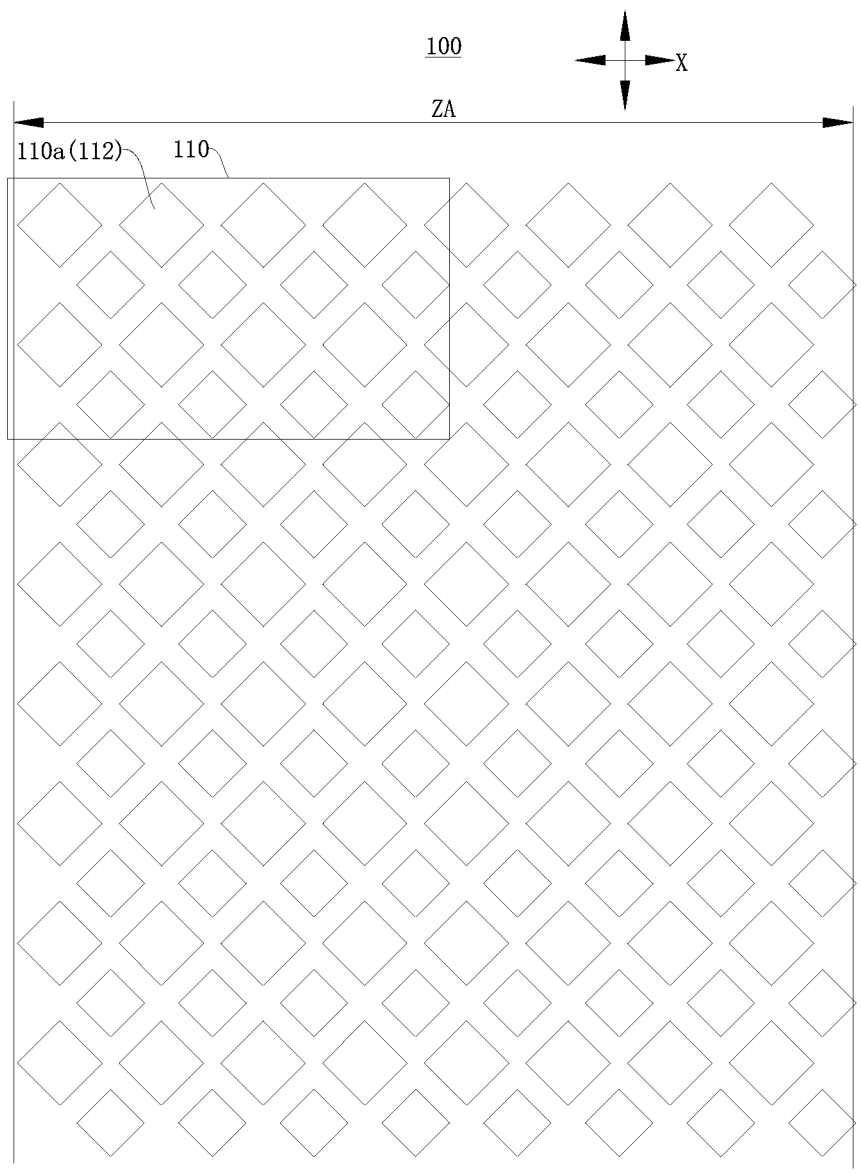
FIG. 4 shows a schematic arrangement structure diagram of sub-pixels in area W in FIG. 1 in an example.
Figure 5:
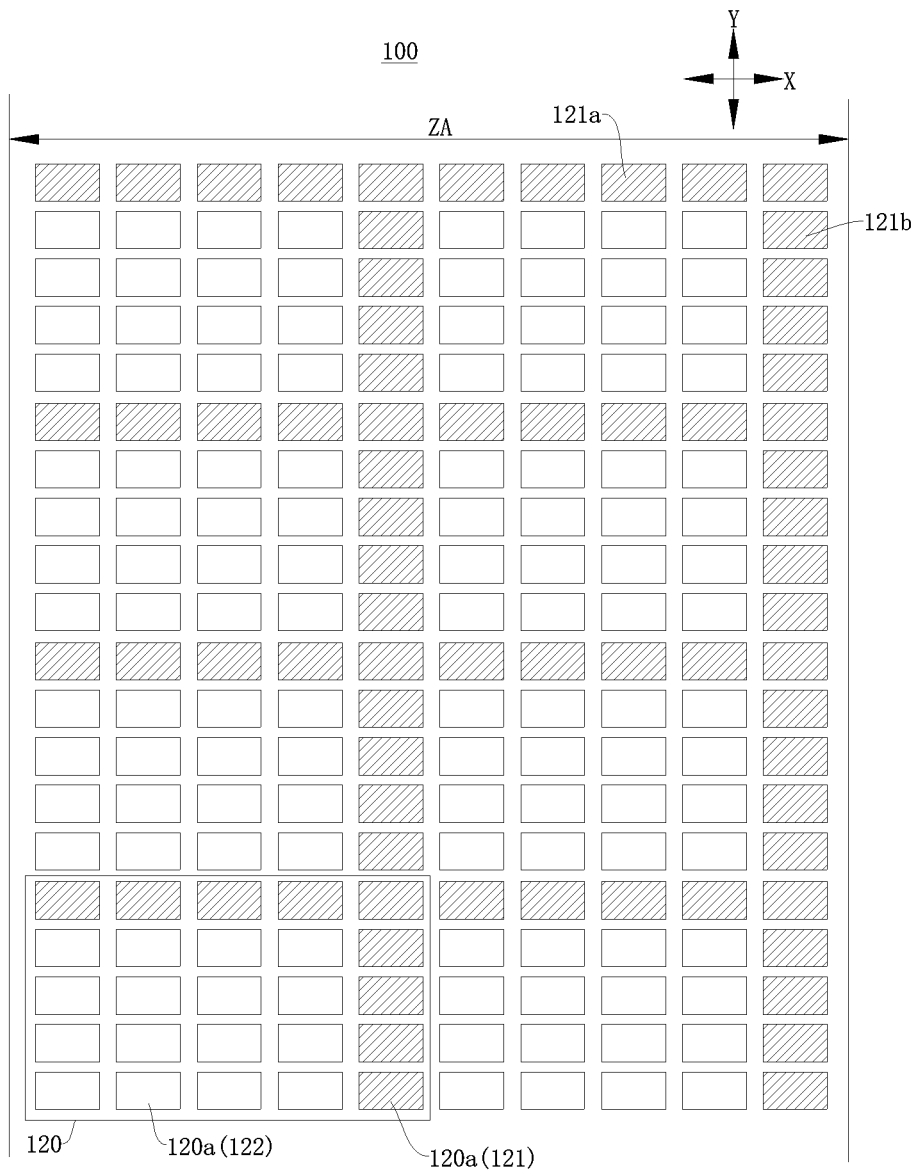
FIG. 5 shows a schematic arrangement structure diagram of pixel circuits in area W in FIG. 1 in an example.

Reference is made to FIG. 1 to FIG. 5 together, in which FIG. 4 shows a schematic arrangement structure diagram of the sub-pixels 110*a* in W in FIG. 1, and FIG. 5 shows a schematic arrangement structure diagram of the pixel circuits 120*a* in W in FIG. 1.

In some optional embodiments, as shown in FIG. 1 to FIG. 5, the second display area AA2 includes a main display area ZA and a transition display area TA located between the main display area ZA and the first display area AA1, and at least part of the first circuits 121 located in the transition display area TA are configured to drive the first sub-pixels 111. That is, the first circuits 121 for driving the first sub-pixels 111 are located in the transition display area TA, and the first circuits 121 which are not configured to drive the first sub-pixels 111 are located in the main display area ZA.

In these optional embodiments, the first circuits 121 for driving the first sub-pixels 111 are arranged in the transition display area TA which is closer to the first display area AA1, so that the distance between the first circuit 121 and the first sub-pixel 111 which are electrically connected with each other can be reduced, the length of the connecting line between the first circuit 121 and the first sub-pixel 111 can be reduced, and the signal transmission stability is guaranteed.

Optionally, the circuit block 120 in the main display area ZA is located within the orthographic projection of the pixel block 110 driven by the circuit block 120, and the circuit block 120 in the main display area ZA includes p rows and q columns of the second circuits 122 and (e-p) rows and (f-q) columns of the first circuits 121. Herein, (e-p) rows and (f-q) columns of the first circuits 121 refers to the (e-p) rows and (f-q) columns from the e rows and f columns of the circuit block 120.

For example, still referring to FIG. 4 and FIG. 5, under a condition that the pixel block 110 includes four rows and four columns of the sub-pixels 110*a*, each row includes four sub-pixels 110*a* and each column includes four sub-pixels 110*a*, and the circuit block 120 includes five rows and five columns of the pixel circuits 120*a*, each circuit block 120 in the main display area ZA includes four rows and four columns of the second circuits 122 and one row and one column of the first circuits 121, which refer to one row and one column of the first circuits 121 from the five rows and five columns of the pixel circuits 120*a*. In the one row and one column of the first circuits 121, the one row of the first circuits 121 include five first circuits 121, the one column of the first circuits 121 also include five first circuits 121, and one first circuit 121 is repeated at the intersection position of the one row and one column of the first circuits 121. Therefore, each circuit block 120 in the main display area ZA includes 16 second circuits 122 and 9 first circuits 121.

In these optional embodiments, the number of the second circuits 122 included in the circuit block 120 in the main display area ZA is the same as the number of the second sub-pixels 112 included in the pixel block 110, so that the second circuits 122 in each circuit block 120 can be configured to drive the second sub-pixels 112 in each pixel block 110. The circuit block 120 in the main display area ZA is located within the orthographic projection of the pixel block 110 driven by the circuit block 120, so that the distance between the second circuit 122 and the second sub-pixel 112 driven by the second circuit 122 can be reduced, and the length of the connecting line between the second circuit 122 and the second sub-pixel 112 driven by the second circuit 122 can be reduced.

Optionally, in the main display area ZA, a relative position relationship of the plurality of second circuits 122 in the circuit block 120 is the same as a relative position relationship of the plurality of second sub-pixels 112 in the pixel block 110, so that the distance between the second circuit 122 and the second sub-pixel 112 driven by the second circuit 122 can be further reduced, and the length of the connecting line between the second circuit 122 and the second sub-pixel 112 driven by the second circuit 122 can be reduced.

Optionally, the relative position relationship of the second circuits 122 in the main display area ZA and the second sub-pixels 112 driven by the second circuits 122 may be arranged in a variety of ways.

For example, the orthographic projection of the second circuit 122 in the thickness direction at least partially overlaps the orthographic projection of the second sub-pixel 112 driven by the second circuit 122 in the thickness direction, so that the distance between the second circuit 122 and the second sub-pixel 112 driven by the second circuit 122 can be further reduced, and the length of the connecting line between the second circuit 122 and the second sub-pixel 112 driven by the second circuit 122 can be reduced.

Alternatively, the orthographic projection of the second circuit 122 in the thickness direction is staggered with the orthographic projection of the second sub-pixel 112 driven by the second circuit 122 in the thickness direction, as long as the orthographic projection in the thickness direction of the circuit block 120 where the second circuit 122 is located is located within the orthographic projection in the thickness direction of the pixel block 110 where the second sub-pixel 112 driven by the second circuit 122 is located.

Optionally, as shown in FIG. 5, the first circuit 121 in the circuit block 120 is located at a side of the second circuit 122 in the row direction, or the first circuit 121 is located at a side of the plurality of second circuits 122 in the column direction.

In some other embodiments, in the main display area ZA, the first circuit 121 is located in the middle of the plurality of second circuits 122 in the row direction and/or column direction, so that the staggered size between the second circuit 122 and the second sub-pixel 112 driven by the second circuit 122 is reduce, and the wiring length between the second circuit 122 and the second sub-pixel 112 driven by the second circuit 122 is reduced.

In the transition display area TA, the first circuits 121 and the second circuits 122 may be arranged in a variety of ways. In some optional embodiments, still referring to FIG. 3 to FIG. 5, the arrangement of the first circuits 121 and the second circuits 122 in the transition display area TA is the same as the arrangement of the first circuits 121 and the second circuits 122 in the main display area ZA. That is, the circuit block 120 in the transition display area TA is located within the orthographic projection of the pixel block 110 driven by the circuit block 120, and the circuit block 120 in the transition display area TA includes p rows and q columns of the second circuits 122 and (e-p) rows and (f-q) columns of the first circuits 121. Therefore, the display difference between the transition display area TA and the main display area ZA can be further reduced, the distance between the second circuit 122 in the transition display area TA and the second sub-pixel 112 driven by the second circuit 122 can be reduced, and the length of the connecting line between the second circuit 122 and the second sub-pixel 112 driven by the second circuit 122 can be reduced.

Optionally, in the transition display area TA, a relative position relationship of the plurality of second circuits 122 in the circuit block 120 is the same as a relative position relationship of the plurality of second sub-pixels 112 in the pixel block 110, so that the distance between the second circuit 122 in the transition display area TA and the second sub-pixel 112 driven by the second circuit 122 is reduced, and the length of the connecting line between the second circuit 122 and the second sub-pixel 112 driven by the second circuit 122 is reduced.

In the transition display area TA, the first circuits 121 may be arranged in a variety of ways. In some optional embodiments, the first circuits 121 include a plurality of row circuits 121a arranged side by side in a row direction and column circuits 121b arranged side by side in a column direction, and at least part of the row circuits 121a and/or the column circuits 121b are configured to drive the first sub-pixels 111. The row circuits 121a refer to a plurality of the first circuits 121 arranged in the row direction, and the column circuits 121b refer to a plurality of the first circuits 121 arranged in the column direction. The row direction and the column direction intersect, so the first circuit 121 at the intersection position may be either the row circuit 121a or the column circuit 121b.

In these optional embodiments, no second circuit 122 is arranged in the row where the row circuits 121a are located, and no second circuit 122 is arranged in the column where the column circuits 121b are located. When the first sub-pixels 111 are driven by the row circuits 121a and/or the column circuits 121b, the crosstalk between the connecting line between the first sub-pixel 111 and the second circuit 122 and the connecting line between the second sub-pixel 112 and the second circuit 122 can be avoided.

For example, the distribution pattern of the first circuits 121 is grid shaped and includes a hollow area in which a plurality of second circuits 122 are located, that is, at least two of the first circuits 121 are arranged at intervals, at least part of the second circuits 122 are located between two adjacent first circuits 121, and the first circuits 121 are arranged around the plurality of the second circuits 122. That is, in the circuit block 120, the first circuits 121 are concentrated in a same row and a same column, so that the arrangement of the plurality of second circuits 122 in the circuit block 120 is more concentrated.

The first display area AA1 may be arranged in a variety of ways. For example, still referring to FIG. 1, the first display area AA1 includes a regular area and an irregular area located at at least one side of the regular area in the row direction, and at least part of the first sub-pixels 111 in the irregular area and at least part of the first sub-pixels 111 in the regular area are arranged in a same row.

The irregular area may be arranged in a variety of ways. Still referring to FIG. 1, for example, the irregular area may include a corner area RA arranged around the second display area AA2 and being bent. Under a condition that the first display area AA1 includes the corner area RA, the pixel circuit 120a corresponding to the first sub-pixel 111 in the corner area RA is located in the second display area AA2, so that driving circuits such as a shift register and driving signal lines may be further arranged in the corner area RA, the frame size of the display panel 100 can be reduced.

Optionally, still referring to FIG. 1, the irregular area may further include a photosensitive area UDC, and the second display area AA2 is arranged around at least part of the photosensitive area UDC. Under a condition that the first display area AA1 includes the photosensitive area UDC, the pixel circuit 120a corresponding to the first sub-pixel 111 in the photosensitive area UDC is located in the second display area AA2, so that the light transmittance of the photosensitive area UDC can be increased, which facilitates the under-screen integration of the photosensitive components in the photosensitive area UDC. Moreover, the photosensitive area UDC can display images, the display area of the display panel is increased, and a full-screen design is achieved for the display apparatus.

Optionally, still referring to FIG. 1, the first display area AA1 includes a frame display area BA arranged around the second display area AA2 and including an end frame display area BA1 located at at least one side of the second display area AA2 in a column direction and a side frame display area BA2 located at at least one side of the second display area AA2 in a row direction. Under a condition that the first display area AA1 includes the frame display area BA, the pixel circuit 120a corresponding to the first sub-pixel 111 in the frame display area BA is located in the second display area AA2, so that driving circuits such as a shift register and driving signal lines may be further arranged in the frame display area BA, the frame size of the display panel 100 can be reduced, and a narrow frame design or even a frame-free design can be achieved for the display panel 100.

Optionally, the regular area may include the above frame display area BA, and the regular area may further include a part of the first display area AA1 located at at least one side of the photosensitive area UDC in the row direction. Under a condition that the irregular area includes the corner area RA, the corner area RA may be connected between the end frame display area BA1 and the side frame display area BA2 that are adjacent.

The first sub-pixels 111 located in different areas may be driven by different first circuits 121. In some optional embodiments, still referring to FIG. 3, at least part of the row circuits 121a are configured to drive the first sub-pixels 111 located in the irregular area. Therefore, the first sub-pixels 111 in a same row in the irregular area may be driven by the row circuits 121a in a same row, which can simplify the wiring between the first sub-pixels 111 and the row circuits 121a. In addition, the first sub-pixels 111 in the irregular area are driven by the row circuits 121a, only a row signal line for transmitting driving signals to the row circuits 121a needs be to added, and no additional column signal line is necessary, so that the number of signal lines in the second display area AA2 can be reduced.

As shown in FIG. 2 and FIG. 3, under a condition that the first display area AA1 includes the photosensitive area UDC, the first sub-pixels 111 in the photosensitive area UDC may be driven by the row circuits 121a. Optionally, as shown in FIG. 3, various rows of the first sub-pixels 111 in the first display area AA1 may be driven by the row circuits 121a in different rows, that is, the first sub-pixels 111 in different rows are driven by the row circuits 121a in different rows. In some other embodiments, referring to FIG. 6, a plurality of rows of the first sub-pixels 111 in the first display area AA1 may be driven by the row circuits 121a in a same row, that is, two or more rows of the first sub-pixels 111 may be driven by the row circuits 121a in a same row.

Optionally, under a condition that the first sub-pixels 111 in the irregular area are driven by the row circuits 121a in the transition display area TA, a row signal line may be added in the transition display area TA to transmit driving signals to the row circuits 121a.

Figure 6:
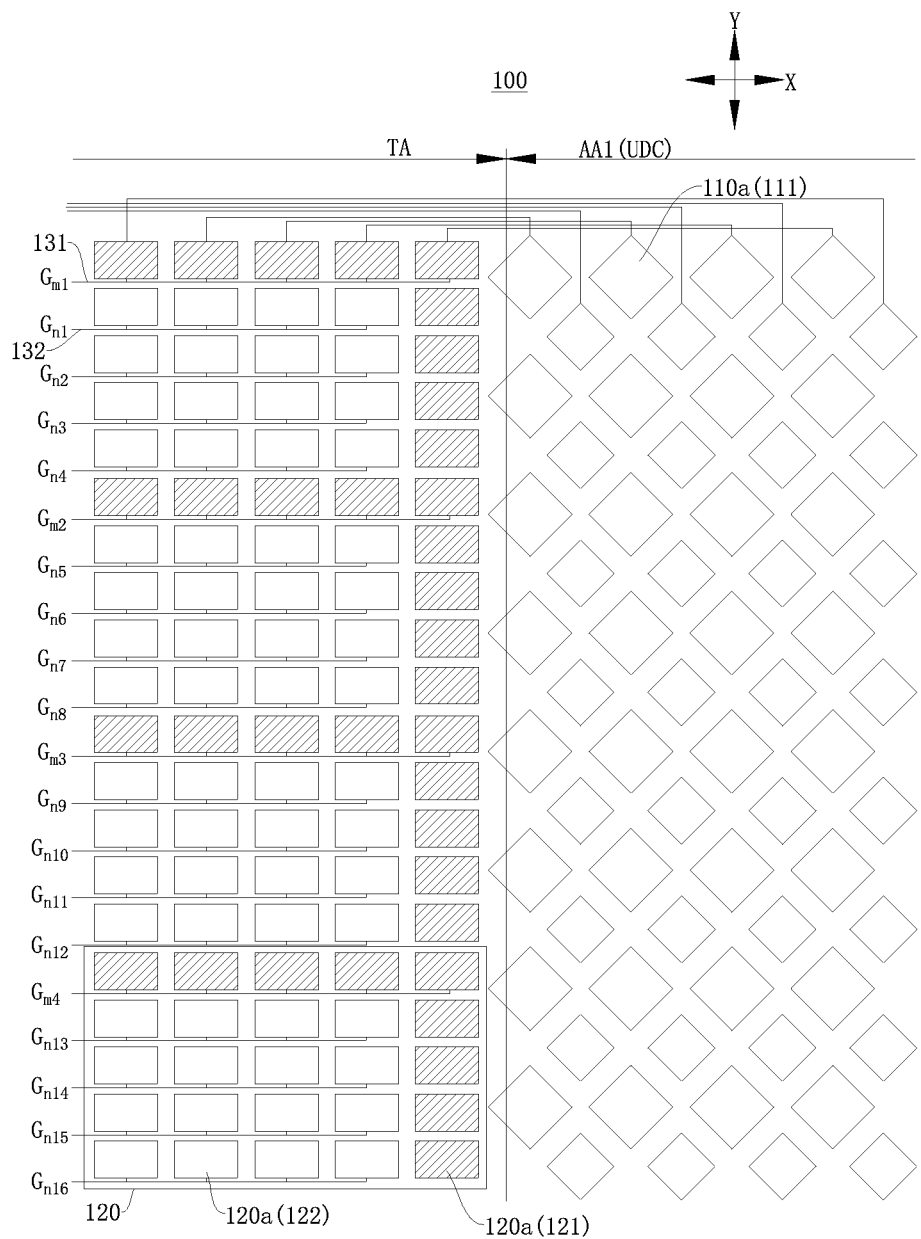
FIG. 6 shows a schematic arrangement structure diagram of pixel circuits in area Q in FIG. 1 in another example.

In some optional embodiments, still referring to FIG. 6, the display panel 100 further includes first row signal lines 131 and second row signal lines 132, the first row signal lines 131 are connected with the row circuits 121*a* for driving the first sub-pixels 111 and configured to transmit signals to the row circuits 121*a*, and the second row signal lines 132 are connected with the second circuits 122 and configured to transmit signals to the second circuits 122. In these optional embodiments, the first row signal lines 131 are added to transmit driving signals to the row circuits 121*a*, thereby enabling the row circuits 121*a* to drive the first sub-pixels 111 to display.

Figure 7:
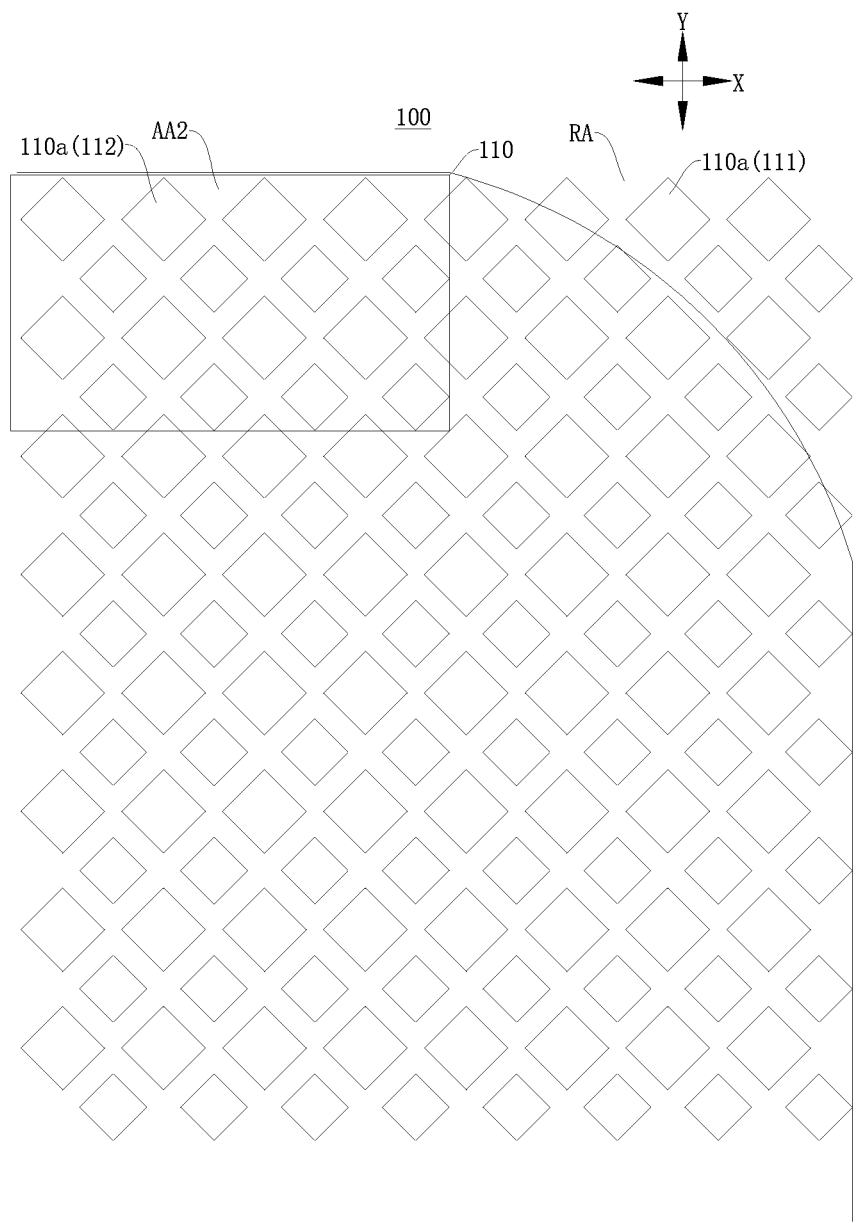
FIG. 7 shows a schematic arrangement structure diagram of sub-pixels in area P in FIG. 1 in an example.
Figure 8:
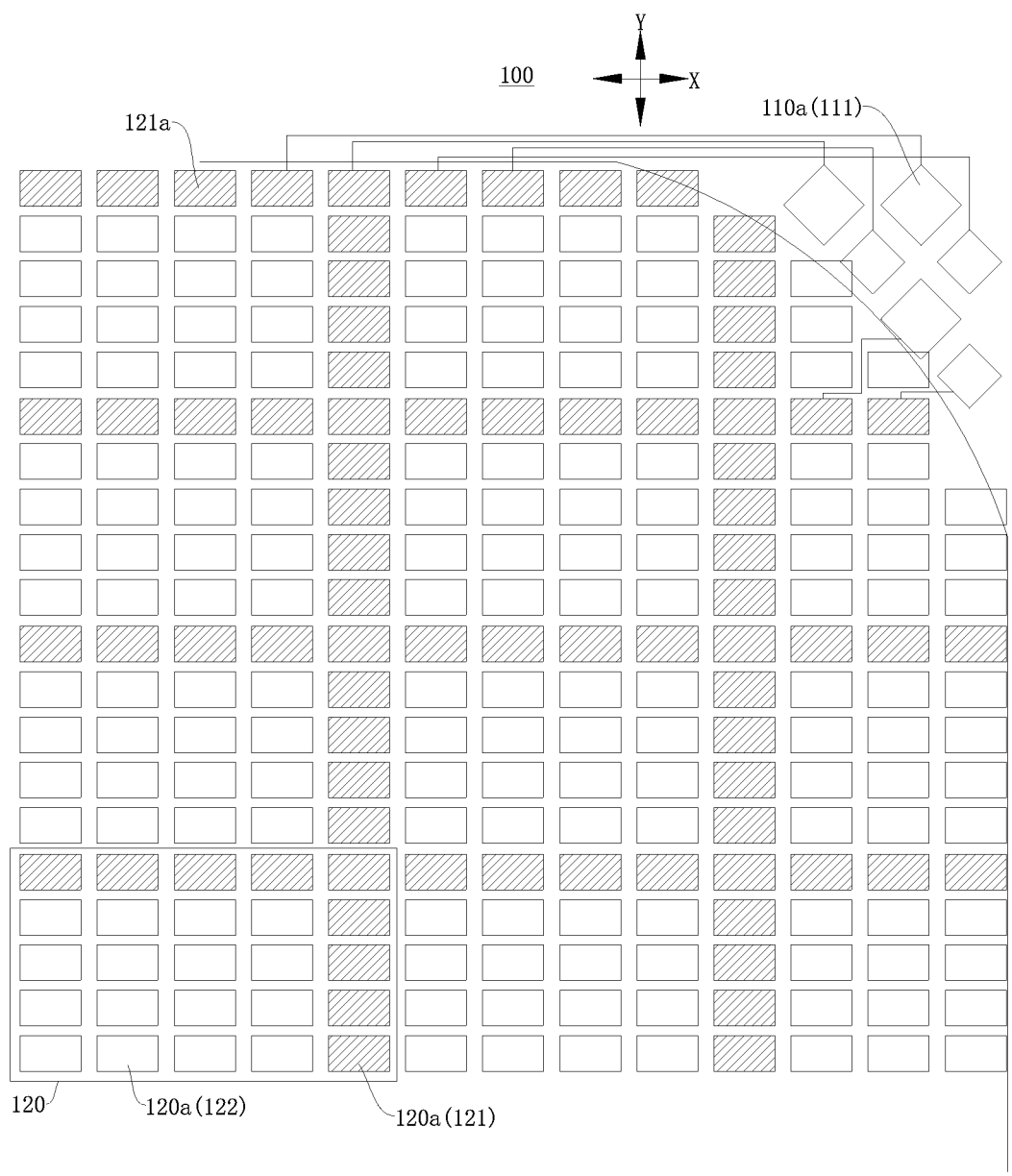
FIG. 8 shows a schematic arrangement structure diagram of pixel circuits in area P in FIG. 1 in an example.

Reference is made to FIG. 1, FIG. 7 and FIG. 8, in which FIG. 7 shows a schematic arrangement structure diagram of the sub-pixels 110*a* in P in FIG. 1, and FIG. 8 shows a schematic structural diagram of the pixel circuits 120*a* in P in FIG. 1. Herein, the first sub-pixels 111 in the corner area RA are illustrated in FIG. 8.

Figure 9:
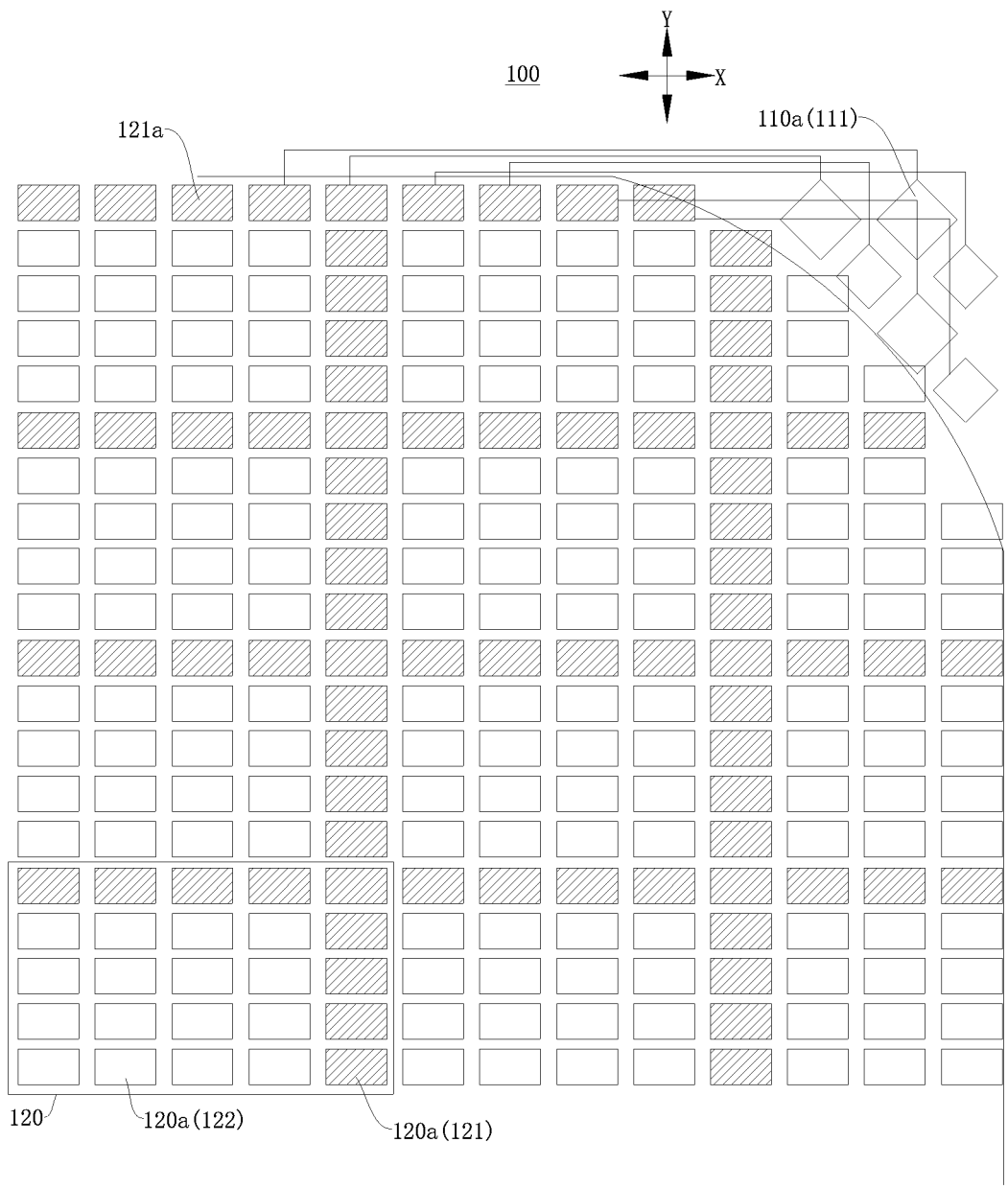
FIG. 9 shows a schematic arrangement structure diagram of pixel circuits in area P in FIG. 1 in another example.

As shown in FIG. 7 and FIG. 8, under a condition that the first display area AA1 includes the corner area RA, the first sub-pixels 111 in the corner area RA may be driven by the row circuits 121*a* in the second display area AA2. As shown in FIG. 8, a plurality of rows of the first sub-pixels 111 in the corner area RA may be driven by a plurality of rows of the row circuits 121*a*. Alternatively, as shown in FIG. 9, a plurality of rows of the first sub-pixels 111 in the corner area RA may be driven by the row circuits 121*a* in a same row.

Optionally, the display panel 100 further includes column signal lines (not shown) extending in the column direction and configured to transmit driving signals to the first circuits 121 and/or the second circuits 122 arranged in a same column.

Optionally, the first row signal lines 131 and the second row signal lines 132 may be scanning signal lines, and the column signal lines may be data signal lines. In some other optional embodiments, the first row signal lines 131 and the second row signal lines 132 may be data signal lines, and the column signal lines may be scanning signal lines.

In some optional embodiments, the display panel 100 further includes a row buffer (not shown) for storing driving signals for the first sub-pixels 111 in the irregular area and transmitting driving signals to the first row signal lines 131 according to the driving signals for the first sub-pixels 111 in the irregular area. By adding the row buffer which stores driving signals for the first sub-pixels 111 in the irregular area, the row buffer can transmit driving signals to the first row signal lines 131, thereby driving the row circuits 121*a* through the first row signal lines 131.

Optionally, the display panel 100 includes a pixel jump reduction (PJR) processing module, which can copy and move images. On the basis that the image data has been processed according to the arrangement of the first sub-pixel 111 and the second sub-pixel 112, data corresponding to the first sub-pixel 111 is added in the image data at the position where the row circuit 121*a* for driving the first sub-pixel 111 is located, and these data are stored in the row buffer.

Optionally, the PJR processing module is connected with a digital to analog conversion module, so as to convert the image data to an analog voltage signal through the digital to analog conversion module.

Optionally, under a condition that a plurality of the first sub-pixels 111 form a display unit emitting white light and two adjacent display units share one first sub-pixel 111, this first sub-pixel 111 may be driven to emit light through the first circuits 121 located in the second display area AA2 according to the light emitting requirements of the display unit.

Figure 10:
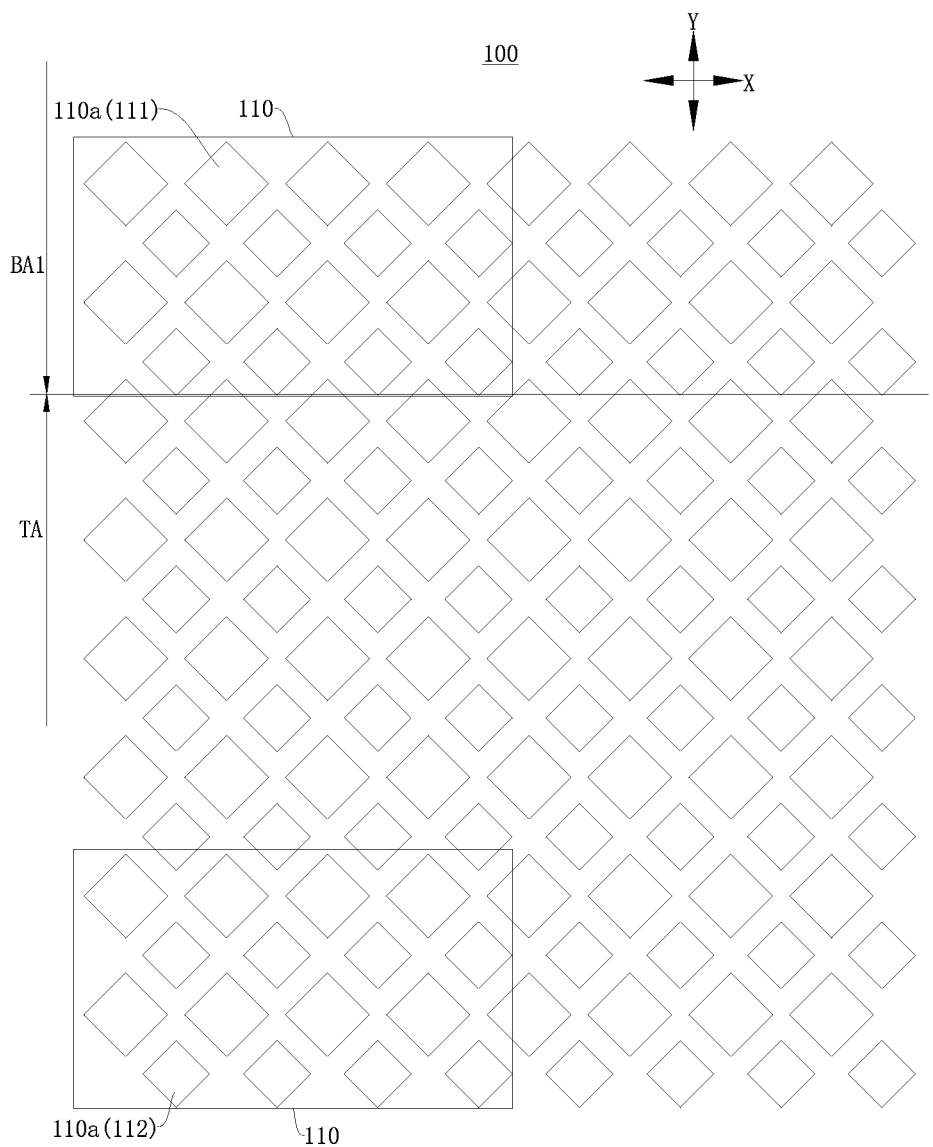
FIG. 10 shows a schematic arrangement structure diagram of sub-pixels in area I in FIG. 1 in an example.
Figure 11:
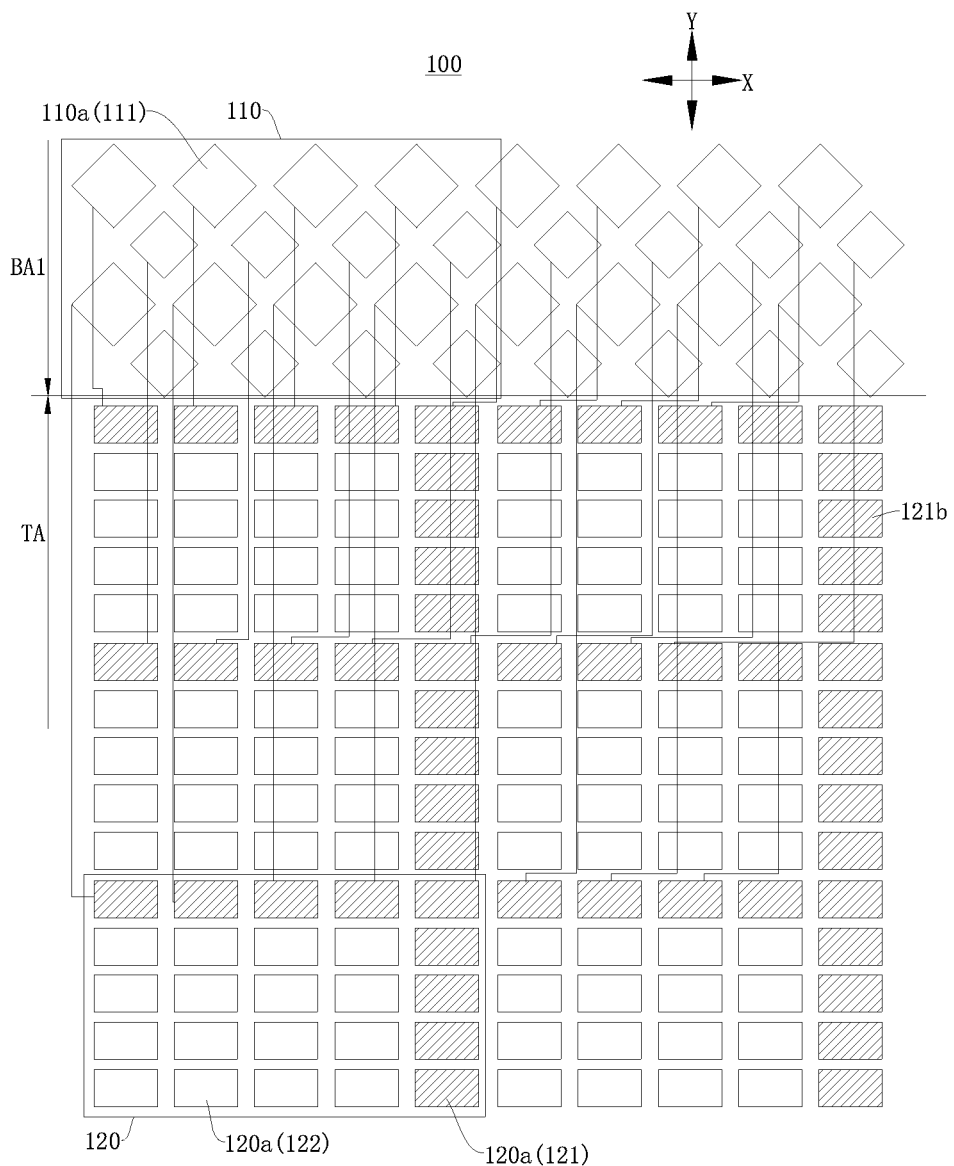
FIG. 11 shows a schematic arrangement structure diagram of pixel circuits in area I in FIG. 1 in an example.
Figure 12:
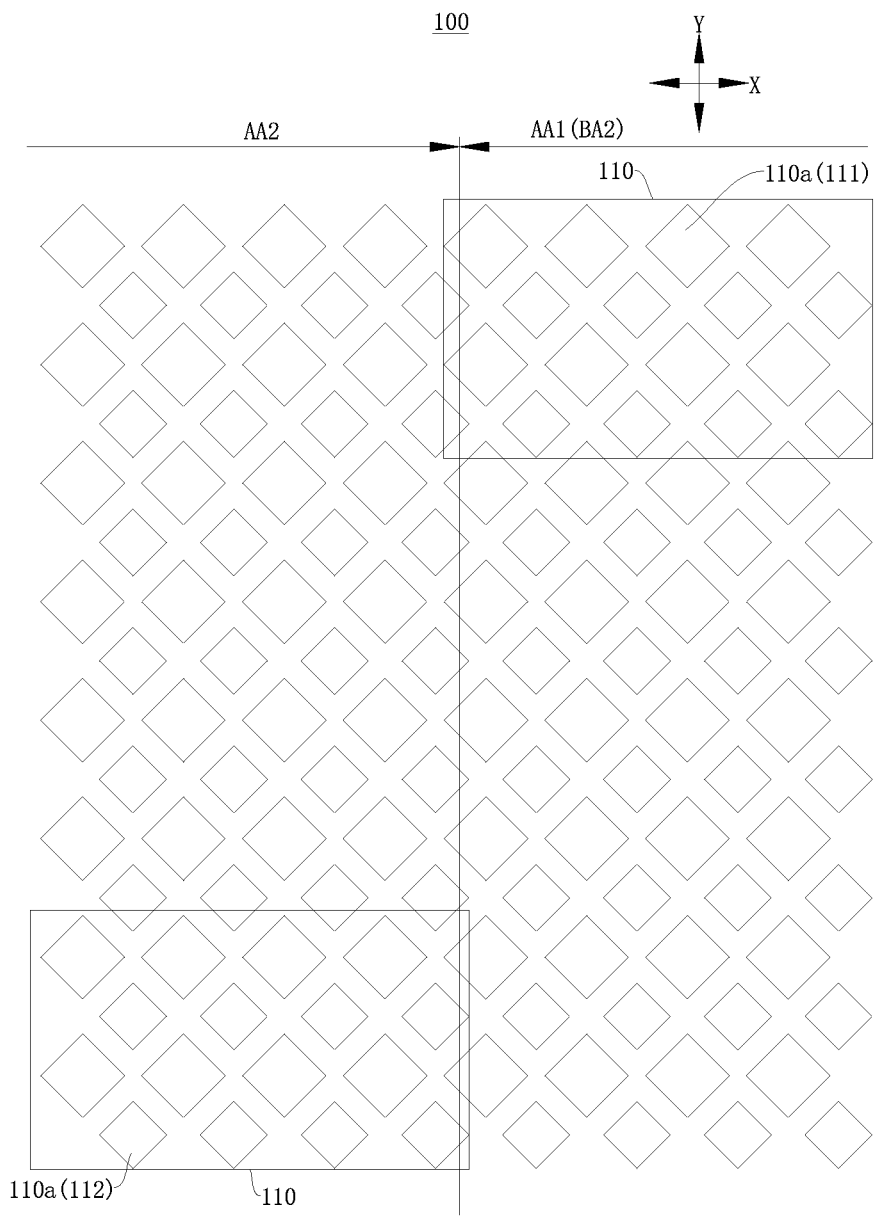
FIG. 12 shows a schematic arrangement structure diagram of sub-pixels in area II in FIG. 1 in an example.
Figure 13:
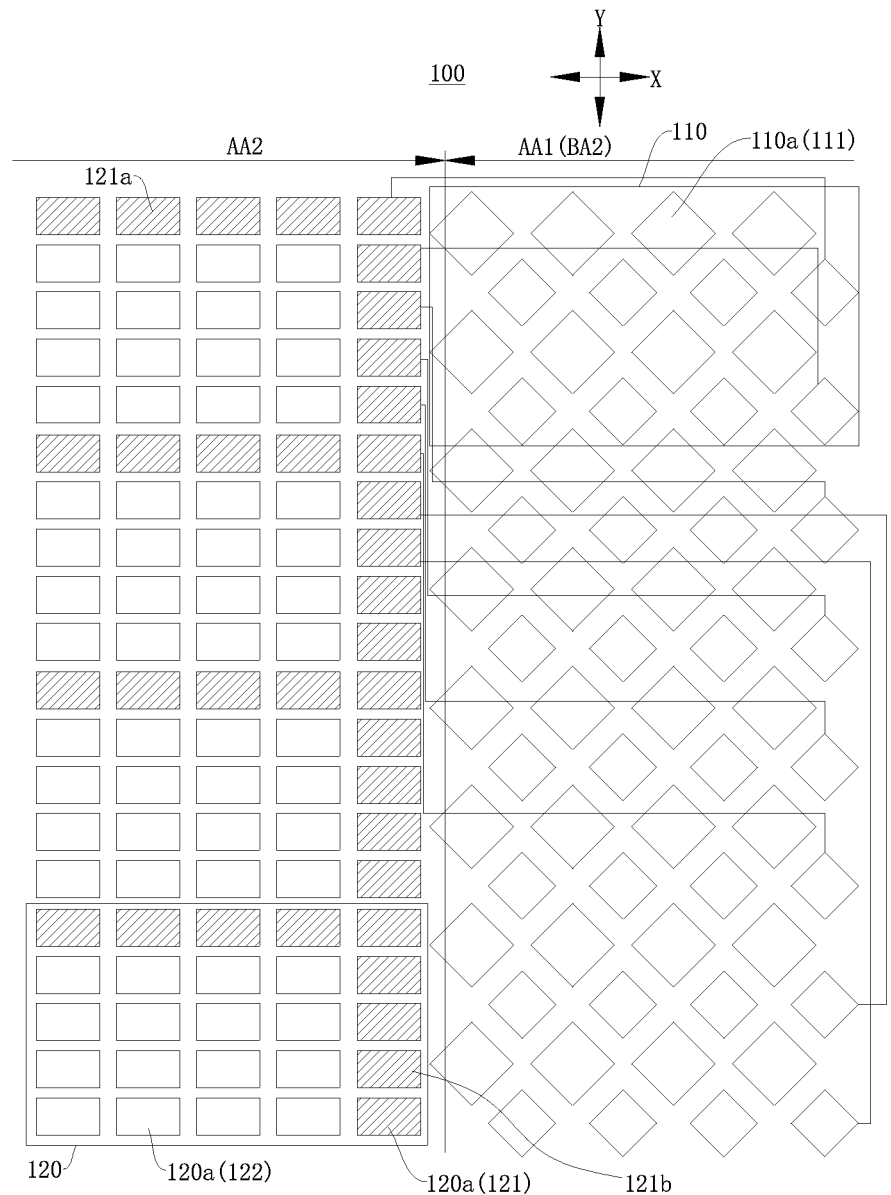
FIG. 13 shows a schematic arrangement structure diagram of pixel circuits in area II in FIG. 1 in an example.

Reference is made to FIG. 1 and FIG. 10 to FIG. 13, FIG. 10 shows a schematic arrangement structure diagram of the sub-pixels 110*a* in I in FIG. 1, FIG. 11 shows a schematic arrangement structure diagram of the pixel circuits 120*a* in I in FIG. 1, in which the first sub-pixels 111 located in the end frame display area BA1 are also illustrated, FIG. 12 shows a schematic arrangement structure diagram of the sub-pixels 110*a* in II in FIG. 1, and FIG. 13 shows a schematic arrangement structure diagram of the pixel circuits 120*a* in II in FIG. 1, in which the first sub-pixels 111 located in the side frame display area BA2 are also illustrated.

The first sub-pixels 111 in the frame display area BA are arranged in rows and columns. For example, as shown in FIG. 10, the first sub-pixels 111 in the end frame display area BA1 are arranged in a plurality of rows, and the number of the first sub-pixels 111 arranged in a same row in the end frame display area BA1 is less than or equal to the number of the row circuits 121*a* arranged in a same row in the transition display area TA. Therefore, the first sub-pixels 111 in a same row in the end frame display area BA1 can be driven by the row circuits 121*a* arranged in a same row in the transition display area TA, and the row signal lines originally for driving the first sub-pixels 111 in a same row in the end frame display area BA1 can be moved to the transition display area TA and connected with the row circuits 121*a* for driving the first sub-pixels 111.

For example, as shown in FIG. 12, the first sub-pixels 111 in the side frame display area BA2 are arranged in a plurality of columns, and the number of the first sub-pixels 111 arranged in a same column in the side frame display area BA2 is less than or equal to the number of the column circuits 121*b* arranged in a same column in the transition display area TA. Therefore, the first sub-pixels 111 in a same column in the side frame display area BA2 can be driven by the column circuits 121*b* arranged in a same column in the transition display area TA, and the column signal lines originally for driving the first sub-pixels 111 in a same column in the side frame display area BA2 can be moved to the transition display area TA and connected with the column circuits 121*b* for driving the first sub-pixels 111.

In some optional embodiments, as shown in FIG. 10 to FIG. 13, at least part of the row circuits 121*a* are configured to drive the first sub-pixels 111 located in the end frame display area BA1, and/or at least part of the column circuits 121*b* are configured to drive the first sub-pixels 111 located in the side frame display area BA2. No additional row signal line or column signal line is necessary, and the wiring of the signal lines of the display panel 100 can be further simplified.

The above describes how to use the first circuits 121 in the transition display area TA to drive the first sub-pixels 111 under a condition that the arrangement of the circuit blocks 120 in the transition display area TA is the same as the arrangement of the circuit blocks 120 in the main display area ZA.

In some other optional embodiments, the arrangement of the circuit blocks 120 in the transition display area TA may be different from the arrangement of the circuit blocks 120 in the main display area ZA.

Figure 14:
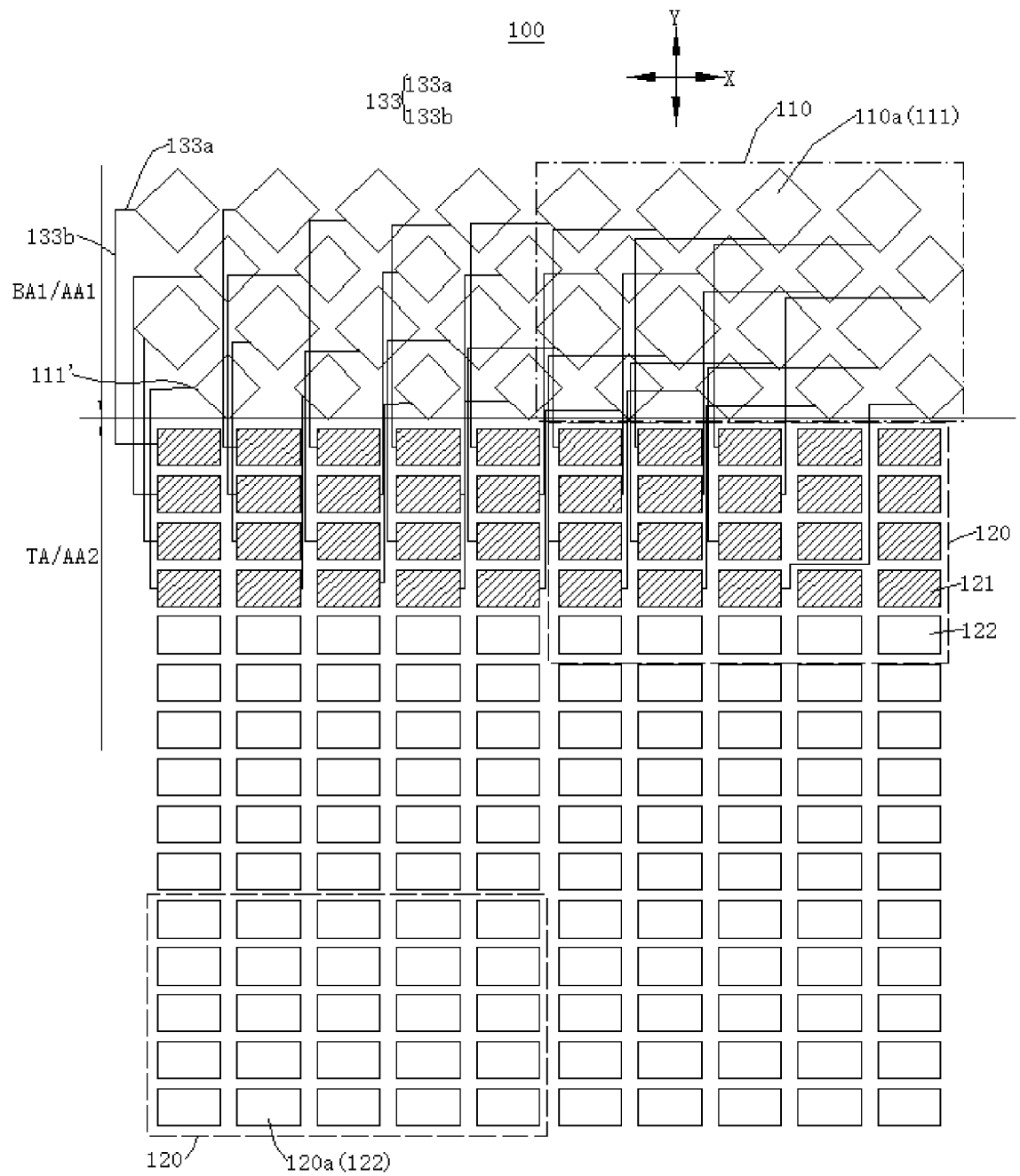
FIG. 14 shows a schematic arrangement structure diagram of pixel circuits in area I in FIG. 1 in another example.

Reference is made to FIG. 14, which shows a schematic arrangement structure diagram of pixel circuits in area I in FIG. 1 in another example.

Optionally, as shown in FIG. 14, the first circuits 121 in the transition display area TA are all located at a side of the second circuits 122 close to the first sub-pixels 111. In these optional embodiments, the first circuits 121 in the transition display area TA are arranged closer to the first display area AA1, which can reduce the distance between the first circuit 121 and the first sub-pixel 111 driven by the first circuit 121.

Optionally, a position relationship of the second circuit 122 for driving the second sub-pixel 112 in the transition display area TA and the first circuits 121 in the transition display area TA for driving the first sub-pixels 111 is the same as a position relationship of the second sub-pixels 112 in the transition display area TA and the first sub-pixels 111 in the first display area AA1. In this way, the distance between the second circuit 122 in the transition display area TA and the second sub-pixel 112 driven by the second circuit 122 and the distance between the first circuit 121 and the first sub-pixel 111 driven by the first circuit 121 can be reduced, and the intersection between the signal line for connecting the first circuit 121 and the first sub-pixel 111 and the signal line for connecting the second circuit 122 and the second sub-pixel 112 can be avoided, which simplifies the wiring of the signal lines.

Furthermore, in these optional embodiments, no additional row signal line or column signal line is necessary, it is only needed that the signal line for driving the first sub-pixel 111 is connected with the first circuit 121 for driving the first sub-pixel 111. The plurality of first circuits 121 in the transition display area TA are arranged according to the arrangement of the plurality of first sub-pixels 111 driven by the plurality of first circuits 121, and the plurality of first circuits 121 are connected with the first sub-pixels 111 in sequence, so that the lengths of a plurality of signal lines for connecting the first circuits 121 and the first sub-pixels 111 tend to be the same, and the plurality of signal lines can be prevented from intersecting with each other.

Only the connection relationship between the first sub-pixels 111 and the first circuits 121 in the end frame display area BA1 is illustrated in FIG. 14.

In some other embodiments, the first display area AA1 may further include a corner area RA, a photosensitive area UDC and a side frame display area BA2, and the first circuits 121 for driving the first sub-pixels 111 in the corner area RA, the photosensitive area UDC and the side frame display area BA2 are located at a side of the second circuits 122 close to the corner area RA, the photosensitive area UDC and the side frame display area BA2. That is, the first sub-pixels 111 in the corner area RA, the photosensitive area UDC and the side frame display area BA2 may also be connected with the first circuits 121 in the transition display area TA in sequence, and a relative position relationship of the first sub-pixels 111 in the corner area RA, the photosensitive area UDC and the side frame display area BA2 and the second sub-pixels 112 in the transition display area TA is the same as a relative position relationship of the first circuits 121 for driving the first sub-pixels 111 in the corner area RA, the photosensitive area UDC and the side frame display area BA2 and the second circuits 122 in the transition display area TA.

Figure 15:
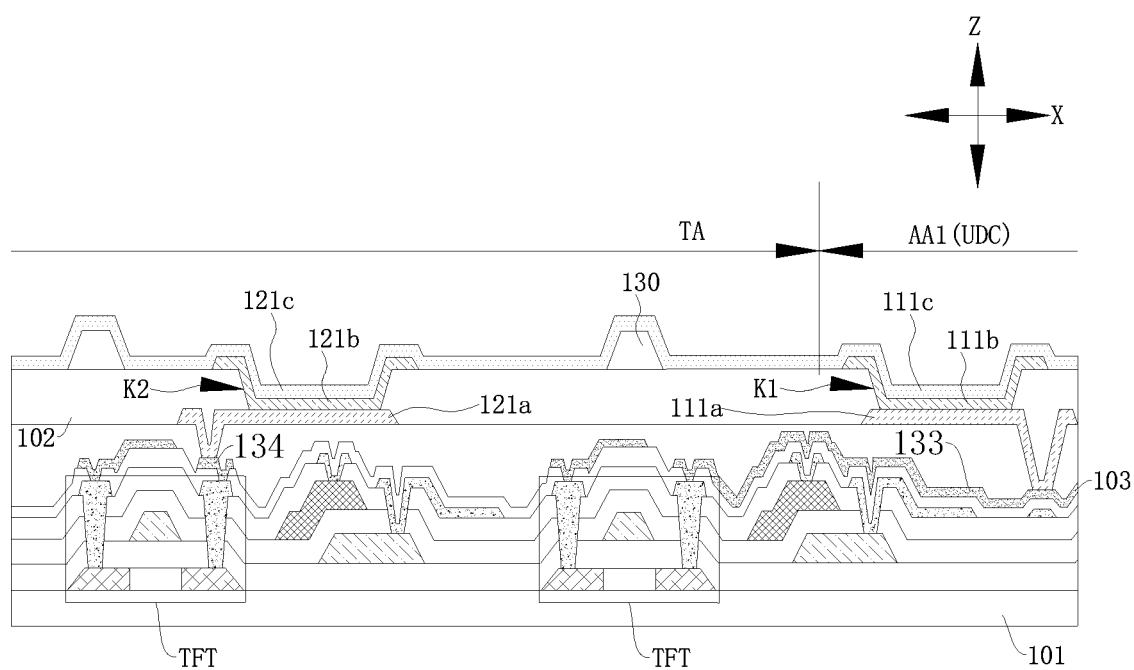
FIG. 15 shows a partial cross-sectional view at C-C in FIG. 2.

Reference is made to FIG. 15, which shows a cross-sectional view at C-C in FIG. 2.

In some optional embodiments, as shown in FIG. 15, the display panel 100 further includes: a signal line layer 103 including first connection signal lines 133 for connecting the first circuits 121 and the first sub-pixels 111.

In these optional embodiments, the crosstalk between the first connection signal line 133 and other signal lines can be avoided by arranging the signal line layer 103.

Optionally, still referring to FIG. 15, the display panel 100 further includes a substrate 101, an array base plate arranged on the substrate 101, and a pixel definition layer 102, in which the pixel circuits 120a are arranged in the array base plate. The pixel definition layer 102 includes a first pixel opening K1 located in the first display area AA1 and a second pixel opening K2 located in the second display area AA2. The first sub-pixel 111 includes a first light-emitting structure 111b located in the first pixel opening K1, a first electrode 111a located at a side of the first light-emitting structure 111b facing the array base plate, and a second electrode 111c located at a side of the first light-emitting structure 111b away from the array base plate. The second sub-pixel 112 includes a second light-emitting structure 121b located in the second pixel opening K2, a third electrode 121a located at a side of the second light-emitting structure 121b facing the array base plate, and a fourth electrode 121c located at a side of the second light-emitting structure 121b away from the array base plate. The first electrode 111a and the third electrode 121a are, for example, pixel electrodes, and the second electrode 111c and the fourth electrode 121c may be interconnected as a common electrode.

Optionally, the signal line layer 103 may be located between the array base plate and a light-emitting layer. The array base plate may include a first metal layer, a second metal layer and a third metal layer, and the pixel circuit 120a includes a thin film transistor (TFT), which may be a switching thin film transistor and a driving thin film transistor. The thin film transistor (TFT) includes a semiconductor layer, a gate, a source electrode, and a drain electrode, in which the gate may be located in the first metal layer, and the source electrode and the drain electrode may be located in the third metal layer. One electrode plate of a capacitor may be arranged in the second metal layer, and the other electrode plate of the capacitor may be located in the first metal layer or the third metal layer.

Optionally, the row signal line is a scanning line and may be located in the first metal layer and interconnected with the gate of the switching thin film transistor. Optionally, the display panel 100 further includes a column signal line which is a data line and located in the third metal layer, and the column signal line may be interconnected with one of the source electrode and the drain electrode of the switching thin film transistor.

Optionally, the source electrode and the drain electrode of the driving thin film transistor of part of the first circuits 121 are connected with the first electrode 111a of the first sub-pixel 111 through the first connection signal line 133.

In some optional embodiments, still referring to FIG. 14, at least part of the first connection signal line 133 extends in the second direction Y, and the part of the first connection signal line 133 extending in the second direction Y is located in a same film layer. An arrangement size of the first connection signal line 133 in the first direction X is m, an arrangement size in the first direction X of the first sub-pixel 111 adjacent to the second display area AA2 along the second direction Y is n, $2k$ first sub-pixels 111 are arranged in the second direction Y in the first display area AA1, and m and n satisfy n=km+d, in which k is a positive integer, d is a positive number less than m, and d is redundancy of the signal line spacing. One of the first direction X and the second direction Y is the row direction, and the other one is the column direction. Referring to FIG. 14, in the embodiments of the present application, for example, the first direction X is the row direction, and the second direction Y is the column direction.

The arrangement size of the first connection signal line 133 in the first direction X includes both an extension size of the first connection signal line 133 in the first direction X and a spacing size between two first connection signal lines 133 adjacent in the first direction X. The arrangement size of the first sub-pixel 111 in the first direction X is an average arrangement size of the first sub-pixel 111 in the first direction X. For example, i first sub-pixels 111 are arranged in the first direction X, and the size occupied by the i first sub-pixels 111 in the first direction X is j, then the arrangement size n of the first sub-pixels 111 is equal to j/i.

In these optional embodiments, as shown in FIG. 14, for example, the first sub-pixel 111 adjacent to the second display area AA2 in the second direction Y is an adjoining first sub-pixel 111'. The first connection signal lines 133 connected with the first sub-pixels 111 located at a side of the adjoining first sub-pixel 111' away from the second display area AA2 all pass through the adjoining first sub-pixel 111', but the extension size of the adjoining first sub-pixel 111' in the first direction X is limited. Therefore, the number of the first sub-pixels 111 arranged in the second direction Y in the first display area AA1 is related to the size of the adjoining first sub-pixel 111', that is, n=km+d. Under a condition that the number of the first sub-pixels 111 arranged in the second direction Y in the first display area AA1 satisfies the above equation, it can be avoided that the first connection signal lines 133 adjacent in the first direction X are too close or overlap to cause signal crosstalk.

Optionally, under a condition that the first display area AA1 includes the end frame display area BA1, two end frame display areas BA1 are respectively arranged at two sides of the second display area AA2, then k first sub-pixels 111 are arranged in the second direction Y in one end frame display area BA1. The extension size of the end frame display area BA1 in the second direction Y is less than or equal to the arrangement size of the k first sub-pixels 111 in the second direction Y.

Under a condition that the first display area AA1 is the side frame display area BA2, the first direction X is the column direction, the second direction Y is the row direction, and two side frame display areas BA2 are respectively arranged at two sides of the second display area AA2. Then k first sub-pixels 111 are arranged in the first direction X in one side frame display area BA2, and the extension size of the side frame display area BA2 in the first direction X is less than or equal to the arrangement size of the k first sub-pixels 111 in the first direction X.

Optionally, under a condition that the first display area AA1 is the photosensitive area UDC and the photosensitive area UDC is circular, the radius of the photosensitive area UDC is less than or equal to the arrangement size of the k first sub-pixels 111 in the row direction.

For example, the arrangement size of the first connection signal line 133 in the column direction is 5 μm, the arrangement size of the adjoining first sub-pixel 111' in the column direction is 61.7 μm, then the number of the first connection signal lines 133 that can be arranged on the adjoining first sub-pixel 111' is 11 at most, and the extension size of the first display area AA1 in the row direction is less than or equal to the arrangement size of the 11 first sub-pixels 111 in the row direction.

In some optional embodiments, still referring to FIG. 14, the first connection signal line 133 includes a first segment 133a and a second segment 133b extending along different directions and located in different film layers, so as to reduce the risk of short circuit between different first connection signal lines 133.

In some optional embodiments, the signal line layer 103 further includes second connection signal lines 134 for connecting the second circuits 122 and the second sub-pixels 112. The first connection signal line 133 and the second connection signal line 134 are arranged in a same layer, which can reduce the thickness of the display panel 100.

In some optional embodiments, the plurality of first circuits 121 for driving the first sub-pixels 111 in a same row are located in a same row, so that the plurality of first circuits 121 for driving the first sub-pixels 111 in a same row may be connected with a same first row signal line 131.

Optionally, the first circuits 121 in a same row are configured to drive two or more rows of the first sub-pixels 111. For example, under a condition that the first display area AA1 includes the irregular area, the row circuits 121a in the transition display area TA closer to the irregular area may be configured to drive two or more rows of the first sub-pixels 111 in the irregular area, so as to reduce the distance between the first circuit 121 and the first sub-pixel 111 driven by the first circuit 121.

In the present application, without changing the original arrangement of the sub-pixels 110a, the first display area AA1 is reserved by arranging the pixel circuits 120a in the second display area AA2, and the light transmittance of the first display area AA1 can be increased, or other driving circuits and driving signal lines can be arranged in the first display area AA1 so as to reduce the frame size of the display panel 100. In the present application, the arrangement of the circuit blocks 120 is the same as the arrangement of the pixel blocks 110 in the second display area AA2, and display effect at different positions in the second display area AA2 is guaranteed to be uniform.

The embodiments of the present application further provide two arrangements of the pixel circuits 120a and the manner in which the pixel circuits 120a drive the first sub-pixels 111 to display.

In a first implementation, the arrangement of the circuit blocks 120 in the transition display area TA is the same as the arrangement of the circuit blocks 120 in the main display area ZA, the row circuits 121a in the transition display area TA are configured to drive the first sub-pixels 111 in the irregular area, and the first row signal lines 131 and the row buffer are added to transmit driving signals to the row circuits 121a in the transition display area TA. On the one hand, this embodiment can ensure that, in the transition display area TA and the main display area ZA, the second circuit 122 is close to the second sub-pixel 112 driven by the second circuit 122, and on the other hand, the row signal line alone is sufficient to drive the first sub-pixels 111, so that the wiring of the display panel 100 can be simplified.

In a second implementation, the pixel block 110 and the circuit block 120 in the main display area ZA are arranged correspondingly in the thickness direction, the distance between the second circuit 122 and the second sub-pixel 112 driven by the second circuit 122 in the main display area ZA can be reduced. The arrangement of the first circuits 121 and the second circuits 122 in the transition display area TA is the same as the arrangement of the second sub-pixels 112 in the transition display area TA and the first sub-pixels 111 in the first display area AA1, the circuit block 120 where the second circuit 122 in the transition display area TA is located is staggered with the pixel block 110 where the second sub-pixel 112 driven by the second circuit 122 is located, and the plurality of first circuits 121 are connected with the first sub-pixels 111 in sequence, which can not only make the lengths of a plurality of signal lines for connecting the first circuits 121 and the first sub-pixels 111 tend to be the same, but also can prevent the plurality of signal lines from intersecting with each other.

Therefore, in the embodiments of the present application, by reducing the size of the first circuit 121 and the size of the second circuit 122, the number of the pixel circuits 120*a* is greater than the number of the sub-pixels 110*a* arranged in a same area, and the pixel circuits 120*a* for driving the first sub-pixels 111 can be arranged in the second display area AA2. Moreover, the width of the first display area AA1 is related to the number of the first connection signal lines 133 that can be accommodated in the arrangement size of the adjoining first sub-pixel 111', that is, the number $2k$ of the first sub-pixels 111 arranged in a same row in the first display area AA1, the arrangement size n of the adjoining first sub-pixel 111' in the row direction, and the arrangement size m of the first connection signal line 133 in the row direction satisfy $n=km+d$.

In some embodiments, the circuit structure of the first circuit 121 is any of a 2T1C circuit, a 7T1C circuit, a 7T2C circuit, or a 9T1C circuit. Herein, the "2T1C circuit" refers to the pixel driving circuit including two thin film transistors (T) and one capacitor (C), and the same applies to the "7T1C circuit", "7T2C circuit", "9T1C circuit", and so on.

Optionally, the circuit structure of the second circuit 122 is any one of the 2T1C circuit, the 7T1C circuit, the 7T2C circuit, or the 9T1C circuit.

Optionally, the size of the first sub-pixel 111 is less than the size of the second sub-pixel 112 of a same color, which can reduce the space occupied by the first sub-pixels 111 in the first display area AA1, so that the non-light-emitting area in the first display area AA1 is larger, which is beneficial for increasing the light transmittance of the first display area AA1.

In some optional embodiments, the first sub-pixels 111 and the first circuits 121 are arranged in one-to-one correspondence. Each first sub-pixel 111 is driven by a corresponding first circuit 121, which can improve the display effect of the display panel 100.

Optionally, two or more adjacent first sub-pixels 111 of a same color are connected with a same first circuit 121 to facilitate the wiring of the display panel 100.

Optionally, as described above, the first sub-pixel 111 includes the first light-emitting structure 111*b*, the first electrode 111*a*, and the second electrode 111*c*. The second sub-pixel 112 includes the second light-emitting structure 121*b*, the third electrode 121*a*, and the fourth electrode 121*c*. In the embodiment, for example, the first electrode 111*a* and the third electrode 121*a* are anodes, and the second electrode 111*c* and the fourth electrode 121*c* are cathodes.

The first light-emitting structure 111*b* and the second light-emitting structure 121*b* may each include an OLED light-emitting layer, and according to design requirements, the first light-emitting structure 111*b* and the second light-emitting structure 121*b* may further each include at least one of a hole inject layer, a hole transport layer, an electron inject layer, or an electron transport layer.

In some embodiments, the first electrode 111*a* is a light-transmitting electrode. In some embodiments, the first electrode 111*a* includes an indium tin oxide (ITO) layer or an indium zinc oxide layer. In some embodiments, the first electrode 111*a* is a reflective electrode including a first light-transmitting conductive layer, a reflective layer located on the first light-transmitting conductive layer, and a second light-transmitting conductive layer located on the reflective layer. The first light-transmitting conductive layer and the second light-transmitting conductive layer may be ITO, indium zinc oxide, and the like, and the reflective layer may be a metal layer made of, for example, silver. The third electrode 121*a* may be made of the same material as the first electrode 111*a*.

In some embodiments, the second electrode 111*c* includes a magnesium-silver alloy layer. The fourth electrode 121*c* may be made of the same material as the second electrode 111*c*.

In some embodiments, an orthographic projection of each first light-emitting structure 111*b* on the substrate 101 is consist of one first graphic unit or two or more first graphic units jointed together, and the first graphic unit includes at least one selected from a group including a round shape, an oval shape, a dumb-bell shape, a gourd shape and a rectangle shape.

In some embodiments, an orthographic projection of each first electrode 111*a* on the substrate 101 is consist of one second graphic unit or two or more second graphic units jointed together, and the second graphic unit includes at least one selected from a group including a round shape, an oval shape, a dumb-bell shape, a gourd shape and a rectangle shape.

In some embodiments, an orthographic projection of each second light-emitting structure 121*b* on the substrate 101 is consist of one third graphic unit or two or more third graphic units jointed together, and the third graphic unit includes at least one selected from a group including a round shape, an oval shape, a dumb-bell shape, a gourd shape and a rectangle shape.

In some embodiments, an orthographic projection of each third electrode 121*a* on the substrate 101 is consist of one fourth graphic unit or two or more fourth graphic units jointed together, and the fourth graphic unit includes at least one selected from a group including a round shape, an oval shape, a dumb-bell shape, a gourd shape and a rectangle shape.

Exemplarily, the display panel 100 may further include an encapsulation layer, and a polarizer and a cover plate located on the encapsulation layer. Alternatively, the cover plate may be directly arranged on the encapsulation layer without the polarizer, or at least the cover plate may be directly arranged on the encapsulation layer in the first display area AA1 without the polarizer, so as to prevent the polarizer from affecting the light collection amount of the photosensitive component correspondingly arranged under the first display area AA1. Of course, the polarizer may also be arranged on the encapsulation layer in the first display area AA1.

Embodiments of a second aspect of the present application provide a display apparatus including the display panel 100 according to any of the embodiments of the first aspect. Since the display apparatus according to the embodiments of the second aspect of the present application includes the display panel 100 according to any of the embodiments of the first aspect, the display apparatus according to the embodiments of the second aspect of the present application has the beneficial effects of the display panel 100 according to any of the embodiments of the first aspect, which are not repeated herein.

The display apparatus according to the embodiments of the present application includes, but is not limited to, a mobile phone, a personal digital assistant (PDA), a tablet computer, e-book, a television, an entrance guard, a smart fixed phone, a console and other devices with a display function.

What is claimed is:

1. A display panel comprising a first display area and a second display area, the display panel further comprising:

a plurality of pixel blocks comprising a plurality of sub-pixels, each of the pixel blocks comprising a sub-pixels of the plurality of sub-pixels, the plurality of sub-pixels comprising a plurality of first sub-pixels located in the first display area and a plurality of second sub-pixels located in the second display area; and a plurality of circuit blocks located in the second display area, each of the circuit blocks comprising b pixel circuits, the b pixel circuits comprising first circuits and second circuits, at least part of the first circuits being configured to drive the first sub-pixels, and the second circuits being configured to drive the second sub-pixels, wherein both a and b are positive integers greater than 0, and a is less than b, in the second display area, an orthographic projection of the circuit block in a thickness direction of the display panel is located within an orthographic projection of the pixel block in the thickness direction.

2. The display panel according to claim 1, wherein in the second display area, the orthographic projection of the circuit block in the thickness direction overlaps the orthographic projection of the pixel block in the thickness direction.

3. The display panel according to claim 1, wherein
the pixel block comprises a plurality of the sub-pixels distributed in p rows and q columns, and a product of p and q is a; and
the circuit block comprises a plurality of the pixel circuits distributed in e rows and f columns, and a product of e and f is b, wherein p, q, e and f are all positive integers greater than 1, e≥p, and f≥q.

4. The display panel according to claim 3, wherein p is equal to q, e is equal to f, and e is greater than p.

5. The display panel according to claim 3, wherein
the second display area comprises a main display area and a transition display area located between the main display area and the first display area, and at least part of the first circuits located in the transition display area are configured to drive the first sub-pixels; and
the circuit block in the main display area is located within the orthographic projection of the pixel block driven by the circuit block, and the circuit block in the main display area comprises p rows and q columns of the second circuits and (e-p) rows and (f-q) columns of the first circuits.

6. The display panel according to claim 5, wherein in the main display area, a relative position relationship of the plurality of second circuits in the circuit block is the same as a relative position relationship of the plurality of second sub-pixels in the pixel block.

7. The display panel according to claim 5, wherein the circuit block in the transition display area is located within the orthographic projection of the pixel block driven by the circuit block, and the circuit block in the transition display area comprises p rows and q columns of the second circuits and (e-p) rows and (f-q) columns of the first circuits.

8. The display panel according to claim 7, wherein in the transition display area, a relative position relationship of the plurality of second circuits in the circuit block is the same as a relative position relationship of the plurality of second sub-pixels in the pixel block.

9. The display panel according to claim 7, wherein the first circuits comprise a plurality of row circuits arranged side by side in a row direction and column circuits arranged side by side in a column direction; and at least part of the row circuits are configured to drive the first sub-pixels; or
at least part of the column circuits are configured to drive the first sub-pixels; or
at least part of the row circuits and the column circuits are configured to drive the first sub-pixels.

10. The display panel according to claim 9, wherein the first display area comprises a regular area and an irregular area located at at least one side of the regular area in the row direction, at least part of the first sub-pixels in the irregular area and at least part of the first sub-pixels in the regular area are arranged in a same row, and at least part of the row circuits are configured to drive the first sub-pixels located in the irregular area.

11. The display panel according to claim 9, further comprising first row signal lines and second row signal lines, the first row signal lines being connected with the row circuits for driving the first sub-pixels and configured to transmit signals to the row circuits, and the second row signal lines being connected with the second circuits and configured to transmit signals to the second circuits.

12. The display panel according to claim 11, further comprising a row buffer configured to store driving signals for the first sub-pixels in the irregular area and transmit driving signals to the first row signal lines according to the driving signals for the first sub-pixels in the irregular area.

13. The display panel according to claim 7, wherein the first display area comprises a frame display area arranged around the second display area and comprising an end frame display area located at at least one side of the second display area in a column direction and a side frame display area located at at least one side of the second display area in a row direction;
at least part of the row circuits are configured to drive the first sub-pixels located in the end frame display area; or
at least part of the column circuits are configured to drive the first sub-pixels located in the side frame display area; or
at least part of the row circuits are configured to drive the first sub-pixels located in the end frame display area, and at least part of the column circuits are configured to drive the first sub-pixels located in the side frame display area.

14. The display panel according to claim 5, wherein the first circuits in the transition display area are all located at a side of the second circuits close to the first sub-pixels.

15. The display panel according to claim 14, wherein a position relationship of the second circuits for driving the second sub-pixels in the transition display area and the first circuits in the transition display area for driving the first sub-pixels is the same as a position relationship of the second sub-pixels in the transition display area and the first sub-pixels in the first display area.

16. The display panel according to claim 1, further comprising:
a signal line layer comprising first connection signal lines configured to connect the first circuits and the first sub-pixels.

17. The display panel according to claim 16, wherein at least part of the first connection signal line extends along a second direction, an arrangement size of the first connection signal line in a first direction is m, an arrangement size in the first direction of the first sub-pixel adjacent to the second display area along the second direction is n, 2k first sub-pixels are arranged in the second direction in the first display area, and m and n satisfy n=km+d, wherein k is a positive integer, and d is a positive number less than m.

18. The display panel according to claim 16, wherein the first connection signal line comprises a first segment and a second segment extending along different directions and located in different film layers.

19. The display panel according to claim 1, wherein
- a plurality of the first circuits for driving the first sub-pixels in a same row are located in a same row; or
- the first circuits in a same row are configured to drive two or more rows of the first sub-pixels; or
- a plurality of the first circuits for driving the first sub-pixels in a same row are located in a same row, and the first circuits in a same row are configured to drive two or more rows of the first sub-pixels.

20. A display apparatus comprising the display panel according to claim 1.

* * * * *